US006713884B2

United States Patent
Weis

(10) Patent No.: US 6,713,884 B2
(45) Date of Patent: Mar. 30, 2004

(54) METHOD OF FORMING AN ALIGNMENT MARK STRUCTURE USING STANDARD PROCESS STEPS FOR FORMING VERTICAL GATE TRANSISTORS

(75) Inventor: Rolf Weis, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 243 days.

(21) Appl. No.: 10/026,347

(22) Filed: Dec. 20, 2001

(65) Prior Publication Data
US 2003/0119274 A1 Jun. 26, 2003

(51) Int. Cl.[7] .................... H01L 23/58; H01L 21/76
(52) U.S. Cl. .................... 257/797; 438/401; 438/404
(58) Field of Search .................... 257/797; 438/400, 438/401, 404, 424

(56) References Cited

U.S. PATENT DOCUMENTS

| 5,897,371 A | * | 4/1999 | Yeh et al. ............ 438/633 |
| 6,030,897 A | * | 2/2000 | Deconinck ............ 438/691 |
| 6,049,137 A | * | 4/2000 | Jang et al. ............ 257/797 |
| 6,080,635 A | * | 6/2000 | Jang et al. ............ 438/401 |
| 6,271,602 B1 | * | 8/2001 | Ackmann et al. ........ 257/797 |
| 6,303,458 B1 | * | 10/2001 | Zhang et al. ............ 438/401 |
| 2003/0157779 A1 | * | 8/2003 | Diewald et al. ........ 438/401 |

* cited by examiner

Primary Examiner—Chandra Chaudhari
Assistant Examiner—William Vesperman
(74) Attorney, Agent, or Firm—Slater & Matsil, L.L.P.

(57) ABSTRACT

An alignment mark structure (22) for aligning a mask with prior formed features of in a circuit region when an opaque material layer (88) covers the alignment mark structure (22) is provided. The features of the alignment mark structure (22) are formed in an alignment mark region (20) concurrently while features for a circuit region having vertical gate transistors are being formed. There are no extra or added processing steps added for forming the alignment mark structure (22) because it is formed concurrently while forming features in the circuit region. The resulting alignment mark structure (22) has step features (62) so that the step features (62) can be seen after the opaque material layer (88) covers the alignment mark structure (22).

14 Claims, 15 Drawing Sheets

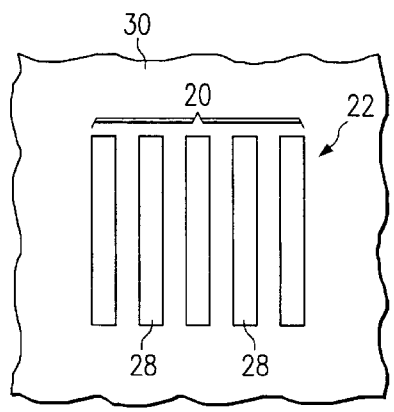
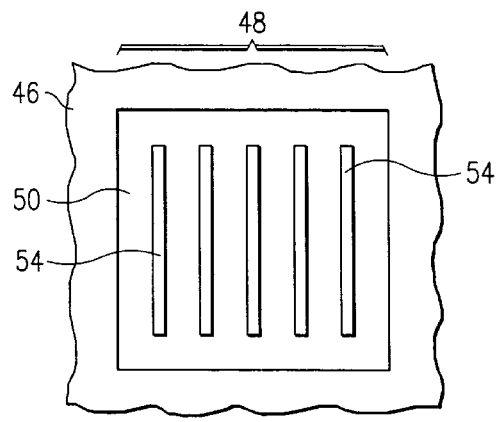
FIG. 6     FIG. 7
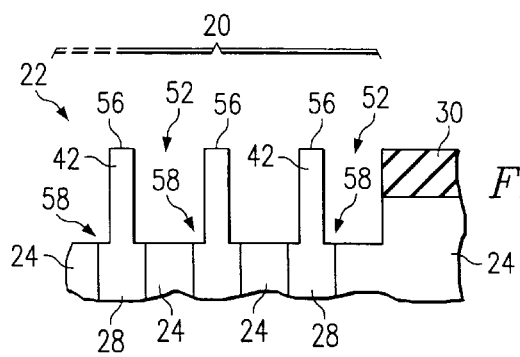
FIG. 8
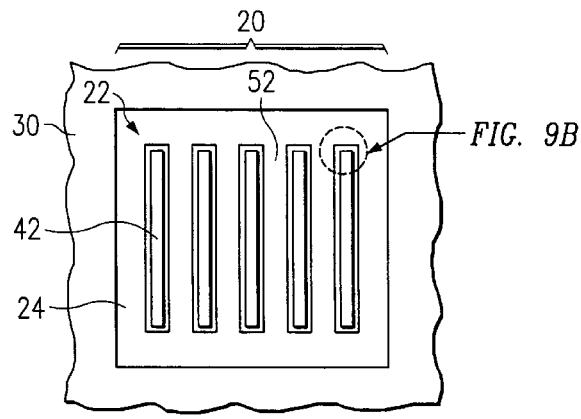 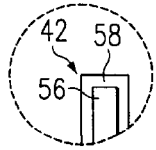
FIG. 9A     FIG. 9B

METHOD OF FORMING AN ALIGNMENT MARK STRUCTURE USING STANDARD PROCESS STEPS FOR FORMING VERTICAL GATE TRANSISTORS

FIELD OF THE INVENTION

The present invention relates to a method of forming an alignment mark structure using standard process steps for forming vertical gate transistors.

BACKGROUND OF THE INVENTION

During a typical semiconductor fabrication process, there are often one or more process steps involving the use of a mask after an opaque material layer has been formed that covers the wafer. Because such masks typically must be aligned with previously formed features or structures on the wafer, there is a need for an alignment mark, feature, or structure that can still be referenced when such an opaque material layer covers the wafer. A planar alignment mark covered by the opaque material layer does not provide much use at this stage if it cannot be seen through the opaque material layer.

Also, non-planar alignment features or structures are sometimes not useful when covered by an opaque material layer. Depending on the resulting thickness of the opaque material layer and/or depending on the type of process used to form the opaque material layer, a step feature or a trench of an alignment mark structure may not have sufficient height or depth to remain visible after forming the opaque material layer.

Conventionally to address these problems, extra processing steps are needed for the sole purpose of forming an alignment mark structure of sufficient size that it will remain visible after forming an opaque material layer over the alignment mark structure. Generally, however, reducing the number of process steps is desirable because this often reduces processing time, reduces materials usage, reduces production costs, reduces alignment error permutations, improves wafer yield, and/or simplifies the overall fabrication process. Thus, it would be highly desirable to reduce or eliminate dedicated processing steps performed solely for the formation of an alignment mark structure.

BRIEF SUMMARY OF THE INVENTION

The problems and needs outlined above are addressed by the present invention. In accordance with one aspect of the present invention, a method for forming an alignment mark structure using standard process steps for forming a vertical gate transistor is provided. The method comprises the following steps, the order of which may vary: (i) forming a deep trench stud in an alignment mark region concurrently with a formation of a vertical gate transistor electrode in a circuit region; (ii) etching the stud to reduce a top area of the stud and forming an isolation trench in the alignment mark region adjacent to the stud, both concurrently with a formation of an isolation trench adjacent to the vertical gate transistor electrode in the circuit region; (iii) filling the alignment mark isolation trench with an insulating material while filling the circuit region isolation trenches with the insulating material; and (iv) removing a portion of the insulating material from the alignment mark isolation trench to a level below the top of the stud so that an upper portion of the stud extends above the insulating material, concurrently with a removal of a portion of the insulating material from the circuit region isolation trenches.

The method may further comprise the steps of: (v) forming an etch stop layer over the alignment mark region, concurrently with a formation of the etch stop layer over at least part of the circuit region; and (vi) shielding the stud from being etched during a subsequent etch, and retaining the stud during the subsequent etch. The etch stop layer may comprise a support gate oxide layer for planar devices in a support area of the circuit region. The method may further comprise the step of: (vii) removing the etch stop layer from the alignment mark structure concurrently with a removal of at least part of the etch stop layer from the circuit region. Also, the method may further comprise the step of: (viii) after the removing etch stop layer step, removing another portion of the insulating material from the alignment mark isolation trench to another level further below the top of the stud, concurrently with a removal of another portion of insulating material from the circuit region, such that the stud extends further above the insulating material of the alignment mark isolation trench. The subsequent etch may be performed to remove at least a portion of a support polysilicon layer formed for building a gate electrode on a planar transistor device in a support area of the circuit region.

The method may further comprise the steps of: (v) forming an etch stop layer over the alignment mark region, concurrently with a formation of the etch stop layer over at least part of the circuit region; (vi) forming a layer of polysilicon over the alignment mark region, concurrently with a formation of the polysilicon layer over at least part of the circuit region; (vii) removing the polysilicon layer at the alignment mark region, concurrently with an etch of at least part of the polysilicon layer at the circuit region; (viii) shielding the stud from being etched and retaining the stud during the step of etching the polysilicon layer; (ix) forming a layer of top oxide over the alignment mark region, concurrently with a formation of the top oxide layer over at least part of the circuit region; and (x) removing the top oxide layer at the alignment mark region, concurrently with an etch of at least part of the top oxide layer at the circuit region, to a level below the top of the stud. The etch stop layer may comprise a nitride material.

The method may still further comprise the step of: (xi) forming an opaque material layer over the alignment mark region, concurrently with a formation of the opaque material layer over at least part of the circuit region. The opaque material layer may comprise metal. The method may still further comprise the steps of: (xi) removing the etch stop layer from the alignment mark structure concurrently with an etch of the circuit region. The method may further comprise the step of: (xii) forming an opaque material layer over the alignment mark region, concurrently with a formation of the opaque material layer over at least part of the circuit region. Or, the method may further comprise the steps of: (xii) removing another portion of the insulating material from the alignment mark isolation trench to another level further below the top of the stud, concurrently with an etch of the circuit region; and (xiii) forming an opaque material layer over the alignment mark region, concurrently with a formation of the opaque material layer over at least part of the circuit region.

The method may further comprise the steps of: (v) forming a first etch stop layer over the alignment mark region, concurrently with a formation of the first etch stop layer over at least part of the circuit region; (vi) forming a layer of top oxide over the alignment mark region, concurrently with a formation of the top oxide layer over at least part of the circuit region; (vii) removing the top oxide layer at the alignment mark region, concurrently with a removal of at least part of the top oxide layer at the circuit region; and (viii) shielding the structures under the first etch stop layer from being removed during the step of removing the top oxide layer. The method may still further comprise the step of: (ix) removing the first etch stop layer at the alignment mark region, concurrently with a removal of at least part of the first etch stop layer at the circuit region. The method may still further comprise the steps of: (x) forming a second etch stop layer over the alignment mark region, concurrently with a formation of the second etch stop layer over at least part of the circuit region; (xi) forming a layer of polysilicon over the alignment mark region, concurrently with a formation of the polysilicon layer over at least part of the circuit region; (xii) removing the polysilicon layer at the alignment mark region, concurrently with a removal of at least part of the polysilicon layer at the circuit region; and (xiii) shielding the structures under the second etch stop layer from being removed during the step of removing the polysilicon layer. The method may still further comprise the step of (xiv) forming an opaque material layer over the alignment mark region, concurrently with a formation of the opaque material layer over at least part of the circuit region. Or the method may still further comprise the steps of: (xiv) removing the second etch stop layer at the alignment mark region, concurrently with a removal of at least part of the second etch stop layer at the circuit region; and (xv) forming an opaque material layer over the alignment mark region, concurrently with a formation of the opaque material layer over at least part of the circuit region.

The method may further comprise the steps of: (v) forming a layer of polysilicon over the alignment mark region, concurrently with a formation of the polysilicon layer over at least part of the circuit region; and (vi) forming an opaque material layer over the alignment mark region, concurrently with a formation of the opaque material layer over at least part of the circuit region. Also, the method may further comprise the steps of: (v) forming a layer of top oxide over the alignment mark region, concurrently with a formation of the top oxide layer over at least part of the circuit region; and (vi) removing the top oxide layer at the alignment mark region, concurrently with a removal of at least part of the top oxide layer at the circuit region. The method may still further comprise the step of (vii) removing another portion of the insulating material from the alignment mark isolation trench to another level further below the top of the stud, concurrently with a removal of material from the circuit region, such that the stud extends further above the insulating material of the alignment mark isolation trench. Or the method may still further comprise the steps of: (vii) forming an etch stop layer over the alignment mark region, concurrently with a formation of the etch stop layer over at least part of the circuit region; (viii) forming a layer of polysilicon over the alignment mark region, concurrently with a formation of the polysilicon layer over at least part of the circuit region; (ix) removing the polysilicon layer at the alignment mark region, concurrently with a removal of at least part of the polysilicon layer at the circuit region; and (x) shielding the structures under the etch stop layer from being removed during the step of removing the polysilicon layer. The method may still further comprise the step of (xi) forming an opaque material layer over the alignment mark region, concurrently with a formation of the opaque material layer over at least part of the circuit region. Or the method may still further comprise the steps of: (xi) removing the etch stop layer at the alignment mark region, concurrently with a removal of at least part of the etch stop layer at the circuit region; and (xii) forming an opaque material layer over the alignment mark region, concurrently with a formation of the opaque material layer over at least part of the circuit region. The alignment mark region may be located in a kerf region of a wafer, in the circuit region, and/or the alignment mark structure may be part of an electrical component being formed in the circuit region, for example.

In accordance with another aspect of the present invention, a method for forming an alignment mark structure using standard process steps for forming a vertical gate transistor is provided, which comprises the step of forming a deep trench stud that extends above an adjacent surface in an alignment mark region, concurrently with a formation of a vertical gate transistor electrode in a circuit region. The method may further comprise the step of removing a nitride layer adjacent the stud in the alignment mark region, concurrently with the removal of at least part of the nitride layer in the circuit region. The method may still further comprise the steps of: forming an oxide layer over the alignment mark region, concurrently with the formation of the oxide layer over at least part of the circuit region; and removing the oxide layer in the alignment mark region, concurrently with the removal of at least part of the oxide layer in the circuit region. The method may still further comprise the steps of: forming an etch stop layer over the alignment mark region, concurrently with the formation of the etch stop layer in the circuit region; forming a polysilicon layer over the alignment mark region, concurrently with the formation of the polysilicon layer over at least part of the circuit region; and removing the polysilicon layer in the alignment mark region, concurrently with the removal of at least part of the polysilicon layer in the circuit region.

In accordance with yet another aspect of the present invention, method for aligning a mask with prior formed structures in an active area of a circuit region when an alignment mark region is covered by an opaque material layer is provided, which comprises the steps of: (i) forming an alignment mark structure in the alignment mark region using standard process steps for forming a vertical gate transistor, the forming alignment mark structure step comprising the steps of: (a) forming a deep trench stud in an alignment mark region concurrently with a formation of a vertical gate transistor electrode in a circuit region, (b) etching the stud to reduce a top area of the stud and forming an isolation trench in the alignment mark region adjacent to the stud, both concurrently with a formation of an isolation trench adjacent to the vertical gate transistor electrode in the circuit region, (c) filling the alignment mark isolation trench with an insulating material while filling the circuit region isolation trenches with the insulating material, and (d) removing a portion of the insulating material from the alignment mark isolation trench to a level below the top of the stud so that an upper portion of the stud extends above the insulating material, concurrently with a removal of a portion of the insulating material from the circuit region; (ii) forming the opaque material layer over the alignment mark region, concurrently with a formation of the opaque material layer over at least part of the circuit region; (iii) viewing the alignment mark structure through the mask, wherein a step feature formed by the stud is still present after the opaque material layer covers the alignment mark structure; and (iv) aligning an alignment mark portion of the mask with the alignment mark structure.

In accordance with still another aspect of the present invention, an alignment mark structure for aligning a mask with prior formed features of in a circuit region when an opaque material layer covers the alignment mark structure is provided. The alignment mark structure comprises: an alignment mark region stud, an isolation trench, and a step feature. The alignment mark region stud extends from a deep trench filled with gate material located in an alignment mark region. The alignment mark region stud is formed concurrently with a formation of a circuit region stud for a vertical gate transistor in a circuit region and without requiring additional processing steps solely for the formation of the alignment mark region stud. The alignment mark region stud has a top area defined by an active area mask. The isolation trench is formed adjacent to the deep trench filled with gate material in the alignment mark region. The alignment mark region isolation trench is filled with insulating material. The alignment mark region isolation trench filled with the insulating material is formed concurrently with a formation of an isolation trench filled with the insulating material that is located adjacent to the vertical gate transistor in the circuit region, and without requiring additional processing steps solely for the formation of the alignment mark region isolation trench filled with the insulating material. The step feature is formed between the top of the insulating material in the alignment mark region isolation trench and the top of the alignment mark region stud. The height of the step feature is large enough that the step feature remains visible after the opaque material layer covers the alignment mark structure.

BRIEF DESCRIPTION OF THE DRAWINGS

Other objects and advantages of the invention will become apparent upon reading the following detailed description and upon referencing the accompanying drawings, in which:

FIG. 6 is a plan view of the alignment mark region of FIG. 5;

FIG. 7 is a plan view of an alignment mark area of an active area mask;

FIG. 8 is a cut-away cross-section view of the alignment mark region after using the mask of FIG. 7 and etching;

FIG. 9A is a plan view of the alignment mark region of FIG. 8;

FIG. 9B is an enlarged plan view of a portion of FIG. 9A;

DETAILED DESCRIPTION OF THE INVENTION

Figure 1:
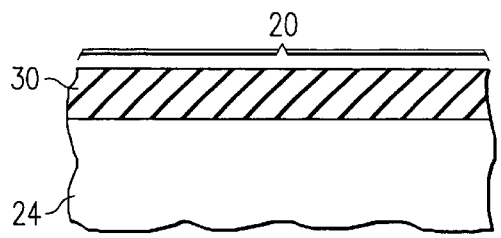
FIG. 1 is a cut-away cross-section view of an alignment mark region of a semiconductor wafer.

Referring now to the drawings, wherein like reference numbers are used herein to designate like elements throughout the various views, methods and embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many possible applications and variations of the present invention in light of the following description.

The present invention provides a way to form an alignment mark structure in an alignment mark region concurrently with the formation of devices, such as vertical gate transistors in a circuit region, but without adding process steps just for the fabrication of the alignment mark structure. In other words, using the present invention, an alignment mark structure is formed using standard process steps being performed concurrently to form devices in the circuit region.

An alignment mark region or area where an alignment mark structure is formed is typically in the kerf or in some other area of the wafer outside of the circuit regions being formed. Alternatively however, the alignment mark region may be within a circuit region or it may be part of an electronic device being formed in the circuit region (e.g., an intermediate structure). For purposes of illustration and to prevent possible confusion, the descriptions of the embodiments herein are limited to having the alignment mark structure formed separately in the kerf. Also, in an actual application, there will likely be multiple alignment mark structures on a wafer. But for simplification and for illustrative purposes, only one alignment mark structure is shown for each embodiment discussed herein. Furthermore, the geometric shape (in a top planar view) of an alignment mark structure may vary, even though only one alignment mark structure shape is shown herein—again for purposes of simplification and illustration only. Thus, the location, number, and shape of an alignment mark structure formed in accordance with the present invention may vary for a given application.

Figure 55:
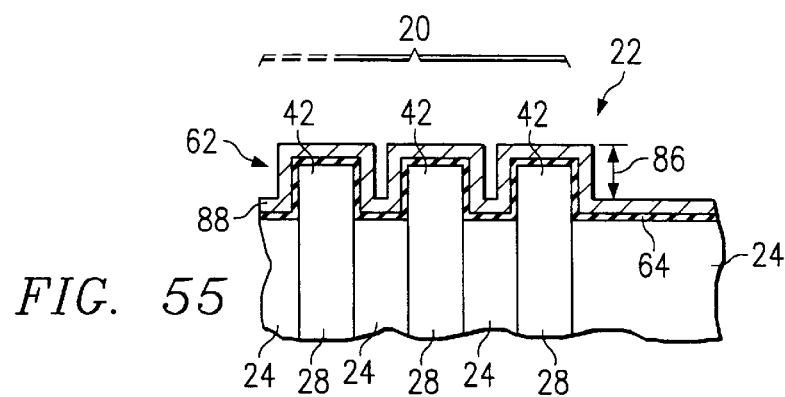
FIG. 55 is a cut-away cross-section view of the alignment mark region of FIG. 54 after applying an opaque material layer thereon, but without removing the etch stop layer.

The following description and FIGS. 1–55 pertain to some of the embodiments and exemplary uses of the present invention and do not limit the scope of the invention to the embodiments described. In the embodiments of the present invention discussed herein, an alignment mark structure is formed concurrently with the fabrication of vertical gate transistors in an active area and planar support devices for a circuit region of a semiconductor device. For a more detailed discussion of some of the possible processing steps for fabricating such a semiconductor device having planar and vertical transistor devices therein, please refer to U.S. patent application Ser. No. 09/888,193 entitled *Method for Forming a Single Wiring Level for Transistors with Planar and Vertical Gates on the Same Substrate* by Rolf Weis filed on Jun. 22, 2001, which application is commonly owned, shares a common inventor, and is incorporated by reference herein to the maximum extent allowable by law.

A first embodiment of the present invention is illustrated in FIGS. 1–22. A goal of the first embodiment is to develop an alignment mark region 20, during and concurrently with the processing steps for developing a circuit region (not shown), to produce an alignment mark structure 22, but without adding additional processing steps solely for the development of the alignment mark structure 22. Starting at the beginning of the alignment mark region development, FIG. 1 shows a cross-section view of part of a semiconductor substrate 24 at the alignment mark region 20. There is a pad nitride layer 30 extending across the top of the substrate 24.

Figure 2:
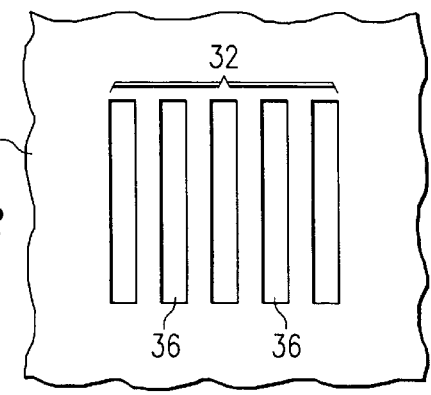
FIG. 2 is a plan view of an alignment mark area of a deep trench mask.
Figure 3:
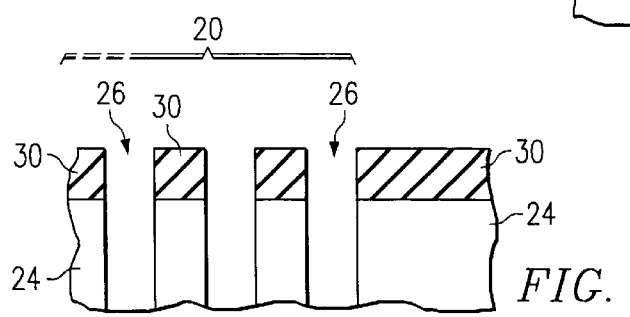
FIG. 3 is a cut-away cross-section view of the alignment mark region after creating deep trenches therein.

FIG. 2 is a plan view of an alignment mark region 32 of a deep trench mask 34 used during the formation of the intermediate structure of FIG. 3. The circuit region of the deep trench mask 34 is not shown. The slots 36 in the deep trench mask 34 at the alignment mark region 32 define the deep trenches 26 formed in the alignment mark region 20, and the alignment mark region slots 36 are similar to those in the circuit region (not shown) that are used to define the deep trenches for the vertical gate transistors (not shown). But, the size and width of the slots 36 used to define the alignment mark region deep trenches 26 may be larger than the slots (not shown) used to define the deep trenches of the circuit region (not shown). Making the alignment mark deep trenches 26 larger will in turn make the alignment mark structure 22 larger, which makes it easier to see during alignment procedures.

Figure 4:
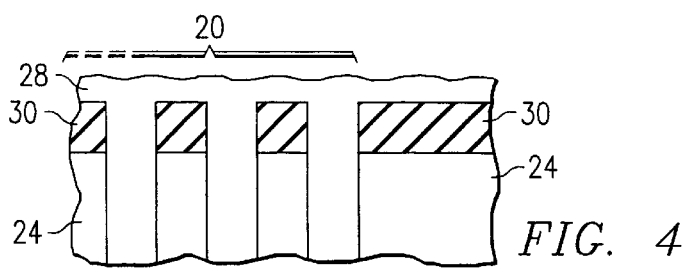
FIG. 4 is a cut-away cross-section view of the alignment mark region of FIG. 3 after filling the deep trenches.

As shown in FIG. 3, after exposure through the deep trench mask 34 and etching, the substrate 24 has a series of deep trenches 26 formed therein. Next as shown in FIG. 4, each of the deep trenches 26 is filled with gate polysilicon 28 to form vertical stud structures, as is being developed concurrently in the circuit region for a vertical gate transistor electrode. Alternatively, the trenches 26 may be filled with some other material, such as silicon-germanium, tungsten or some tungsten alloy, and/or other suitable conductor material, for example.

Figure 5:
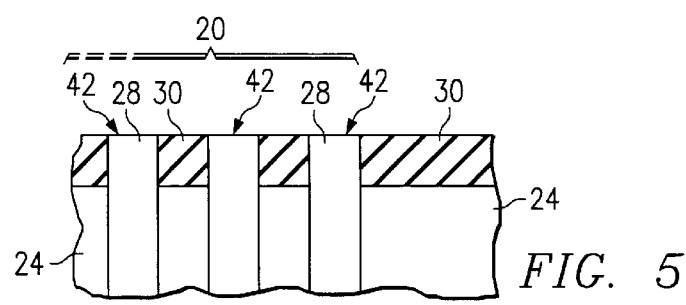
FIG. 5 is a cut-away cross-section view of the alignment mark region after planarizing the surface of FIG. 4.

After being filled (FIG. 4) and after a chemical mechanical polishing (CMP) process, for example, the pad nitride layer 30 is substantially coplanar with the tops of the deep trench studs 42, as shown in FIG. 5. FIG. 6 shows a plan view of the alignment mark region 20 of FIG. 5. The intermediate structure of FIGS. 5 and 6 was formed concurrently with the formation of deep trenches filled with the same gate polysilicon in a circuit region (not shown). Even though the deep trench gate polysilicon 28 is substantially coplanar with the pad nitride 30 at this point, the alignment mark structure 22 can still be seen because the deep trench gate polysilicon 28 typically has contrasting optical properties with respect to the pad nitride 30. However, a planar alignment mark structure is not much use when an opaque material layer covers it if the mark cannot be seen through the opaque material layer.

If needed and if the sequence of steps in developing the circuit region involve a nitride strip, the pad nitride 30 may be removed from a region at and around the deep trench gate polysilicon 28 in the alignment region 20. But in the first embodiment, the pad nitride 30 is retained for now.

FIG. 7 is a plan view showing an alignment mark region 48 on the active area mask 46. The open area 50 shown in the alignment mark region 48 of the active area mask 46 (see FIG. 7) is the area exposed to define the isolation trenches 52 in the alignment mark region 20 (see FIG. 8). In FIG. 7, the parallel bar patterns 54 correspond to the location of the polysilicon studs 42 shown in FIG. 5. However, the area of the parallel bar patterns 54 on the mask 46 of FIG. 7 are smaller than the area of the slots 36 on the mask 34 of FIG. 2, which were used to define the deep trenches 26. Part of the polysilicon stud 42 and the substrate 24 are exposed through an active area mask 46 (or an isolation trench mask) concurrently with the exposure of isolation trench areas in the circuit region (not shown) using the same mask 46. The desired results achieved after exposure through the active area mask 46 of FIG. 7 and etching away parts of the polysilicon studs 42 and silicon substrate 24 are two fold. The first result is that the isolation trenches 52 shown in FIG. 8 are formed in the alignment mark region 20. And the second result is that the top area 56 of the polysilicon studs 42 are reduced. Both of these results shown in FIG. 8 are achieved concurrently with the formation of isolation trenches in the circuit region (not shown).

Note that the formation of the polysilicon studs 42 and the isolation trenches 52 in the alignment mark region 20 did not require any extra steps outside of the standard processing steps used to form the vertical gate electrodes in the circuit region. The only added effort was to add features defining the intermediate alignment mark features to a designated alignment mark region on standard masks used in the production of the vertical gate transistors in the circuit region. Therefore, modifying the standard masks only needs to be done one time at the design stage.

FIG. 9A shows a plan view of the alignment mark region 20 of FIG. 8. FIG. 9B shows an enlargement of the top of one of the polysilicon studs 42 to illustrate the reduced top area 56 of the polysilicon studs 42. The bottom ledges 58 of the polysilicon stud 42 can be seen in FIG. 9B due to the step shape of the polysilicon studs 42 at this stage. By reducing the top area 56 of the polysilicon studs 42 during the active area (or isolation trench) etch, the top area 56 is now defined by and referenced to the active area mask 46. Although the new top areas 56 of the polysilicon studs 42 are shown in FIGS. 8, 9A, and 9B as being centered over the deep trenches 26, this may not be the case in actual production due to alignment inaccuracies and it need not be. For example, the top area 56 of the polysilicon studs 42 could be shifted to the right (not shown) so that the right side bottom ledge 58 is smaller than the left side bottom ledge 58. The top area 56 of the studs 42 could also be shifted up or down in FIG. 9B. Thus, because the active area mask 46 may not be perfectly aligned with the deep trenches 26 or other prior formed features, the new top areas 56 of the studs 42 defined by the active area mask 46 are referenced to the active area mask 46, which is a later step in the process of forming the semiconductor device. This referencing of the polysilicon studs 42 to the active area using the active area mask 46 provides several advantages, which will be discussed below.

Figure 10:
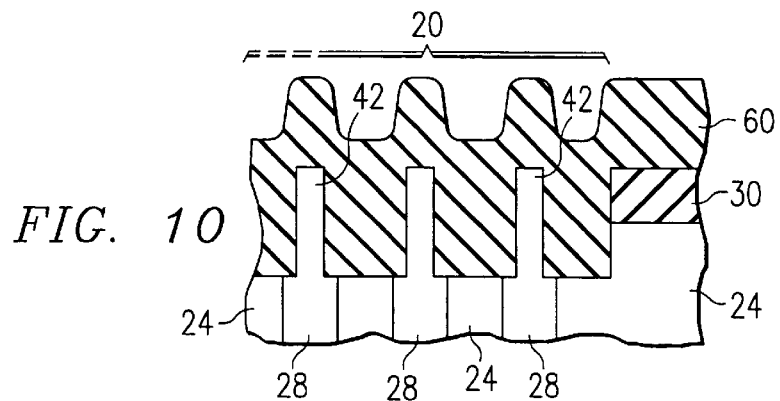
FIG. 10 is a cut-away cross-section view of the alignment mark region after filling the isolation trenches with insulating material.
Figure 11:
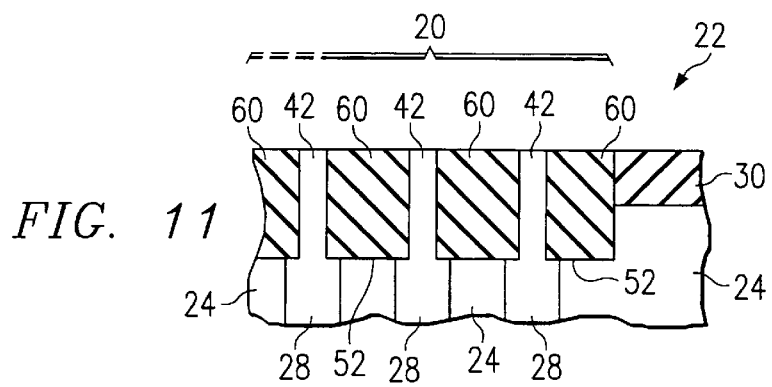
FIG. 11 is a cut-away cross-section view of the alignment mark region of FIG. 10 after planarizing the surface.

After the isolation trenches 52 are formed in the alignment mark region 20 (while forming the isolation trenches in the circuit region—simultaneously), the isolation trenches 52 are filled with isolation trench oxide 60 while filling the circuit region isolation trenches (not shown) with the same isolation trench oxide (see FIG. 10). The excess isolation trench oxide shown in FIG. 10 is typically removed with a chemical mechanical polishing (CMP) process (and/or any other process known to one of ordinary skill in the art that will achieve the same result), which yields the intermediate structure shown in cross-sectional view in FIG. 11.

Figure 12:
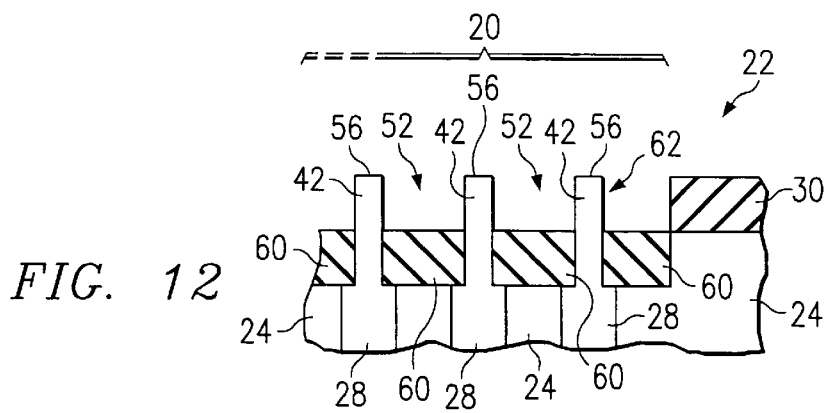
FIG. 12 is a cut-away cross-section view of the alignment mark region of FIG. 11 after deglazing the surface.

Performing an oxide deglaze (and/or any other process known to one of ordinary skill in the art that will achieve the same result) further removes oxide 60 from the isolation trenches 52 (in both the circuit region and the alignment mark region 20) resulting in the intermediate structure shown in FIG. 12. By removing isolation trench oxide 60 from the alignment mark isolation trenches 52 and the circuit region isolation trenches (concurrently in the same processing steps) to a level below the tops of the polysilicon studs 42, the polysilicon studs 42 are exposed and extend out of the isolation trench oxide 60 in the isolation trenches 52 (see FIG. 12). In doing so, a step feature 62 is formed between the top of the isolation trench oxide 60 in the isolation trenches 52 and the top of the polysilicon studs 42. This step feature 62 is desirable, as will be discussed below.

At this point the pad nitride 30 is stripped off (e.g., by etching or any other way known to those of ordinary skill in the art) from the alignment mark region 20 while the pad nitride 30 is removed from the circuit region (not shown). However, the pad nitride layer 30 may be removed at another time during the fabrication process, or it may not be removed. The removal or non removal of the pad nitride 30, or when the pad nitride 30 is removed, is not critical in the present invention. Assuming the pad nitride 30 is removed, the resulting intermediate structure is that of FIG. 13.

Figure 13:
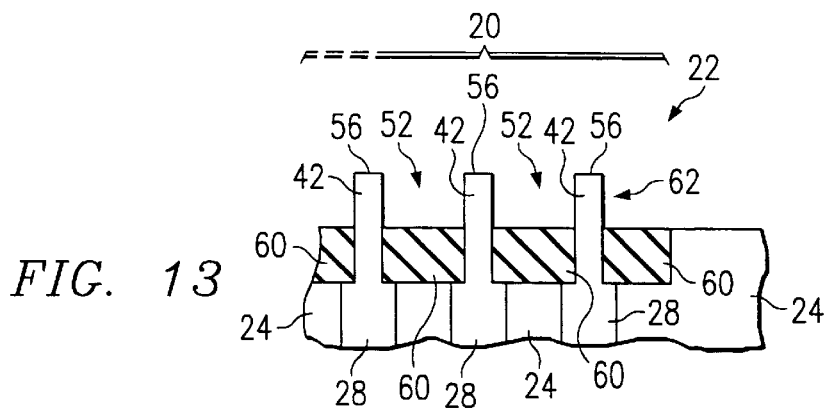
FIG. 13 is a cut-away cross-section view of the alignment mark region of FIG. 12 after stripping the pad nitride layer therefrom.
Figure 14:
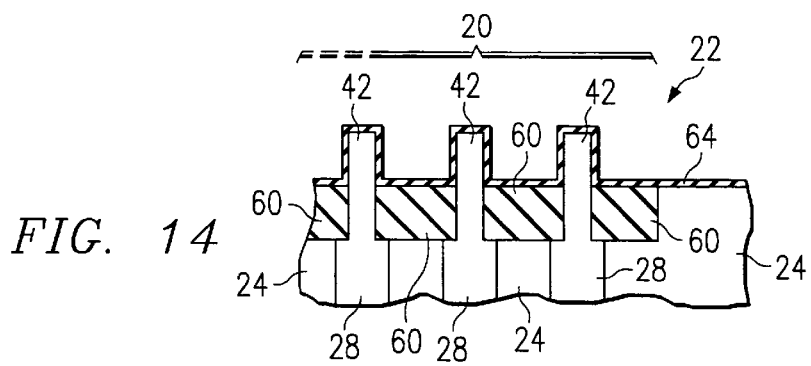
FIG. 14 is a cut-away cross-section view of the alignment mark region of FIG. 13 after applying an etch stop layer thereon.

Next, an etch stop layer 64 is formed over the alignment mark region 20, which covers the intermediate alignment mark structure of FIG. 13, as shown in FIG. 14. The etch stop layer 64 should be a non-silicon material that will shield the polysilicon studs 42 from being etched in subsequent silicon etches that would reduce or remove the studs 42. This etch stop layer 64 is formed concurrently with the formation of this same layer over at least part of the circuit region (not shown), although it may not necessarily have the purpose of being an "etch stop" layer for the circuit region. For example, the etch stop layer 64 of the alignment mark region 20 may be a support gate oxide layer formed over the wafer for the purpose of developing a gate oxide layer for a planar transistor in a support area of the circuit region (not shown). In alternative or in addition, the etch stop layer 64 of FIG. 12 may be formed when a screen oxide layer is formed in the circuit region for use in subsequent doping or implanting process steps in the circuit region (not shown). The etch stop layer 64 also may be formed when a nitride layer is formed in the circuit region. One skilled in the art will realize that the process steps involved in developing the circuit region can vary for a given chip design and layout. Thus, there will be one or more layers formed for the circuit region that may be utilized for being an etch stop layer 64 in the alignment mark region 20.

Figure 15:
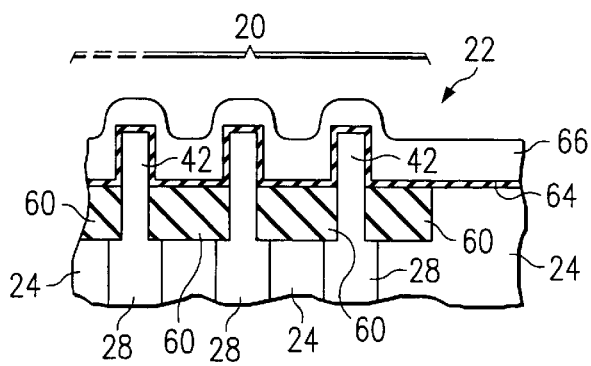
FIG. 15 is a cut-away cross-section view of the alignment mark region of FIG. 14 after applying a polysilicon layer thereon.
Figure 16:
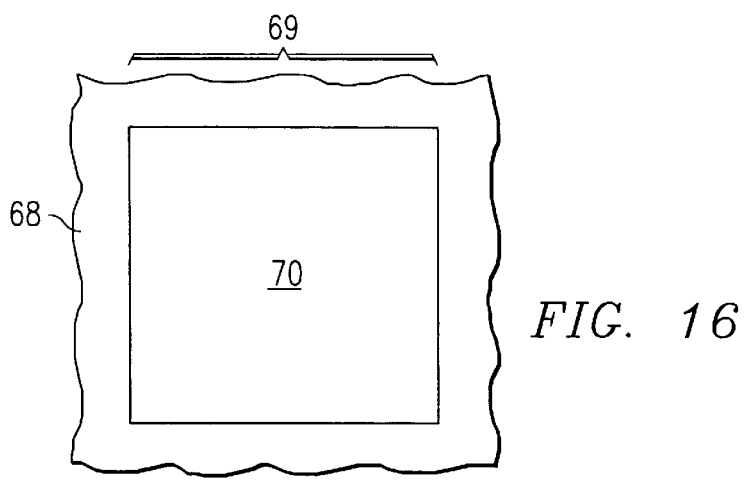
FIG. 16 is a plan view of an alignment mark area of an etch array mask.

In the example embodiments discussed herein, the etch stop layer 64 in the alignment region 20 is an oxide layer formed concurrently with the formation of the support gate oxide layer in the circuit region for a planar transistor in the support area (not shown). Also in this example, a support polysilicon layer 66 is subsequently formed over the alignment mark region 20, as shown in FIG. 15, concurrently with the formation of the support polysilicon layer in the circuit region (not shown), which in this case is again for a planar transistor gate in the support area (not shown).

Figure 17:
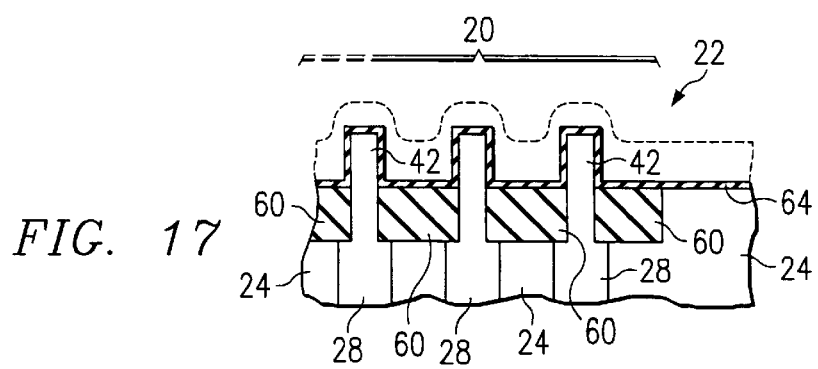
FIG. 17 is a cut-away cross-section view of the alignment mark region of FIG. 15 after removing the polysilicon layer therefrom.

As the support polysilicon layer 66 is masked, exposed, and etched in the circuit region, the etch stop layer 64 over the alignment mark region 20 protects the polysilicon studs 42 in the alignment mark region 20. During the processing of the silicon layers in the circuit region (not shown) at this stage, an etch array mask 68 for example (see FIG. 16), may have an open area 70 at an alignment mark region 69 on the mask 68 corresponding to the location of the alignment mark region 20 on the wafer. Hence, as shown in FIG. 17, the silicon etching of the circuit region (not shown) at this stage will remove the silicon 66 built up during the processing because the etch array mask 68 is open over the alignment mark region 20.

After the silicon etching step or steps, the etch stop layer 64 over the alignment mark region 20 is no longer needed. During subsequent steps for etching materials in the circuit region (e.g., etching oxide) (not shown), the etch stop layer 64 may be removed, but it is not necessary to remove the etch stop layer 64. Because the etch stop layer 64 is conformal to the shape of the studs 42 and the steps 62, and it is relatively thin, the etch stop layer 64 does not significantly take away from height 86 of the desired step features 62. In this example of the first embodiment, the etch stop layer 64 remains for now.

Figure 18:
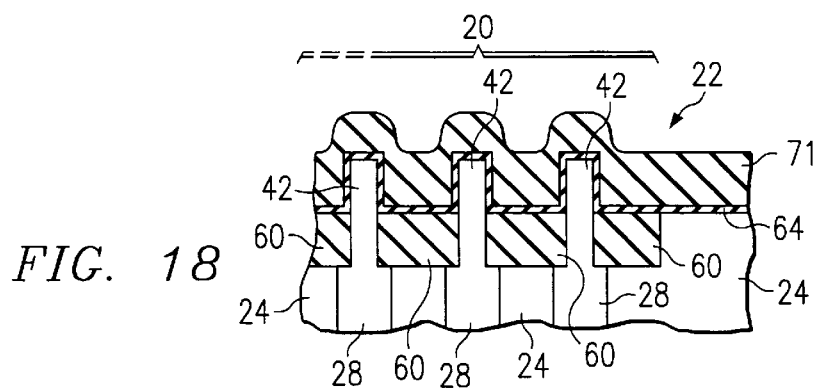
FIG. 18 is a cut-away cross-section view of the alignment mark region of FIG. 17 after applying a top oxide layer thereon.
Figure 19:
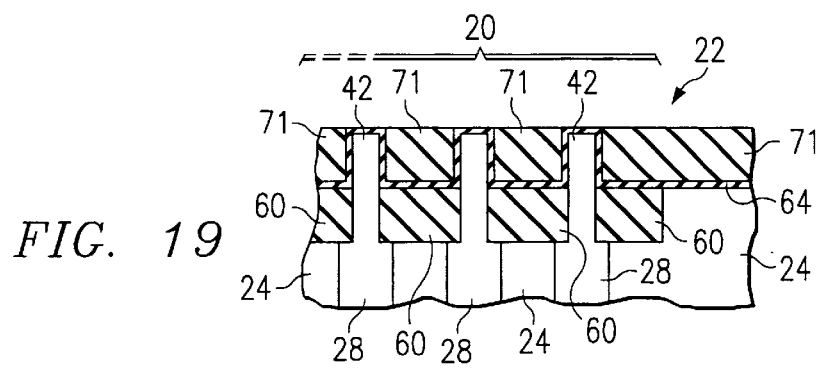
FIG. 19 is a cut-away cross-section view of the alignment mark region of FIG. 18 after planarizing the surface.
Figure 20:
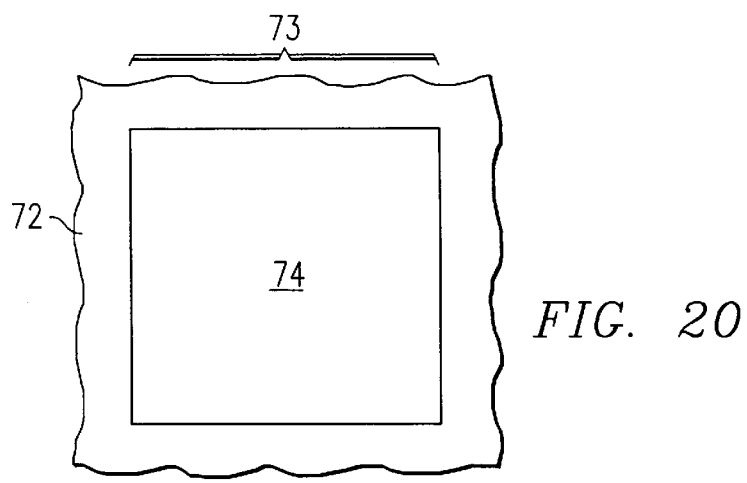
FIG. 20 is a plan view of an alignment mark area of an etch support mask.

As shown in FIG. 18, a top oxide layer 71 is next formed over the etch stop layer 64 at the alignment mark region 20 during processing steps for the circuit region (not shown). The top oxide layer 71 is then planarized during a CMP process (and/or any other equivalent process known to those of ordinary skill in the art) for the processing the circuit region (not shown). Now the alignment mark structure is again planar due to the CMP step, but the alignment mark structure needs a step feature to be seen in subsequent steps when an opaque material layer is applied so that the alignment mark structure can be seen.

As the top oxide layer 71 is masked, exposed, and etched in the circuit region, the top oxide layer 71 in the alignment mark region 20 should be removed. An etch support mask 72 having an open area 74 at an alignment mark region 73 on the mask 72, corresponding to the location of the alignment mark region 20 on the wafer, will allow the top oxide layer 71 to be exposed and thus etched away in the alignment mark region 20. Hence, as shown in FIG. 21, oxide etching (selective to polysilicon and silicon) of the circuit region (not shown) at this stage will remove the top oxide layer 71 at the alignment mark region 20 during the processing because the etch support mask 72 is open over the alignment mark region 20.

In this example with the etch stop layer 64 being an oxide layer, subsequent oxide etching and/or deglazing steps may also remove the etch stop layer 64 from the alignment mark region 20. Also, further etching of an oxide layer or layers in the circuit region (not shown) will further remove part of the isolation trench oxide 60 in the alignment mark region 20, as shown in FIG. 21. In FIG. 21, the first volume 75 between the upper dashed line and middle dashed line 78 is where the top oxide layer 71 was removed. The second volume 76 between the middle dashed line 78 and the lower dashed line 80 is where the etch stop layer 64 was removed. The third volume 82 between the lower dashed line 80 and the surface 84 of the isolation trench oxide 60 indicates where part of the isolation trench oxide 60 was further removed after the etch stop layer removal. Removal of the third volume 82 (i.e., removal of part of the isolation trench oxide 60) is preferred, but optional, because further removal of isolation trench oxide 60 from the alignment mark region 20 can further increase the height 86 of the step feature 62, as shown in FIG. 21. Whether there will be the ability to remove the etch stop layer 64 and further remove isolation trench oxide 60 without adding processing steps solely for the development of the alignment mark structure 22, as in FIG. 21, is dependent on the processing steps involved in developing the circuit region, which may vary.

Figure 21:
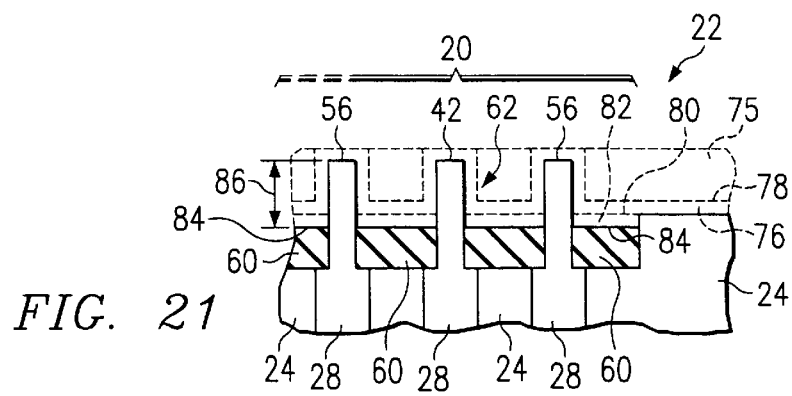
FIG. 21 is a cut-away cross-section view of the alignment mark region of FIG. 19 after removing the top oxide layer, removing the etch stop layer, and removing part of the isolation trench oxide material therefrom.
Figure 22:
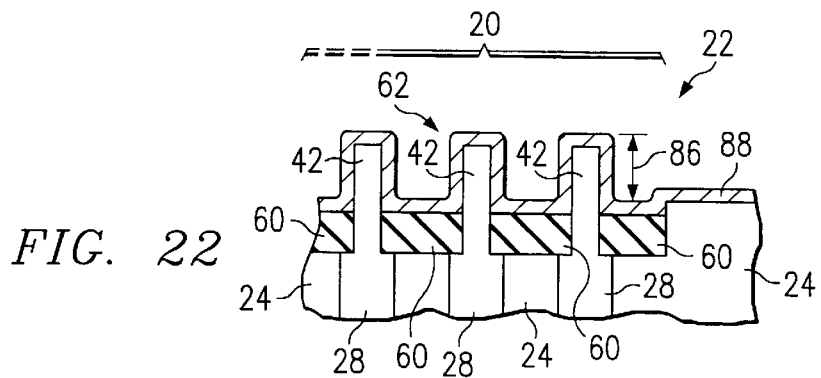
FIG. 22 is a cut-away cross-section view of the alignment mark structure of FIG. 21 after applying an opaque material layer thereon.
Figure 23:
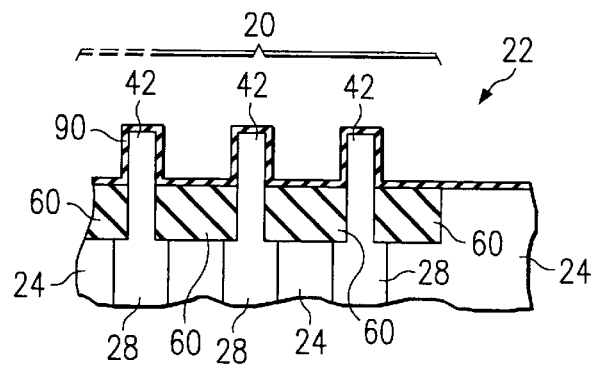
FIG. 23 is a cut-away cross-section view of the alignment mark region of FIG. 13 after applying a first etch stop layer thereon.

The resulting alignment mark structure 22 shown in FIG. 21 (at any of the levels 78, 80, or 84) thus provides a step feature 62 that will be large enough (i.e., have a large enough height 86) to be seen after a subsequent opaque material layer 88 covers the alignment mark structure 22, as shown in FIG. 22. The material of the opaque material layer 88 may vary depending on the processing steps and/or depending on the design and layout of the semiconductor device being formed. Some examples of opaque material layers that are typically encountered during the fabrication of semiconductor devices include, but are not limited to: gate conductor layers (e.g., tungsten, tungsten nitride, and/or tungsten silicide); relatively thick polysilicon (e.g., 720 nm thick); word lines; bit lines; metal wire lines; copper; aluminum; and/or other metal layers. Also, the same alignment mark structure at different stages of the processing may be used for alignment for numerous different opaque material layers.

Continuing with the example of the first embodiment, a gate conductor layer 88 is formed over the alignment mark structure 22 while forming it over the entire wafer (not shown). Even though the gate conductor layer 88 is an opaque material layer, the alignment mark structure 22 can still be seen. Thus, when a gate conductor mask (not shown) needs to be aligned with features in the circuit region, the step features 62 of the alignment mark structure 22 can be seen through an opening in the gate conductor mask at the alignment mark region and the gate conductor mask can be aligned using the alignment mark structure 22.

FIGS. 1–13, 23–28A, and 29–33A illustrate a second embodiment of the present invention. The first steps shown in FIGS. 1–13 for the first embodiment are also the same first steps for the second embodiment. In the first embodiment described above, the etch array mask 68 was used first and the etch support mask 72 was used second, and both masks 68, 72 were open above the alignment mark region 20 on the wafer. In the second embodiment, the etch support mask 72 is used first and the etch array mask 68 is used second. Because the order of these masks 68, 72 varies and the order of the layers being formed and developed in the circuit region are varied, the order of the layers and the use of the layers in the second embodiment differ from that of the first embodiment.

Figure 24:
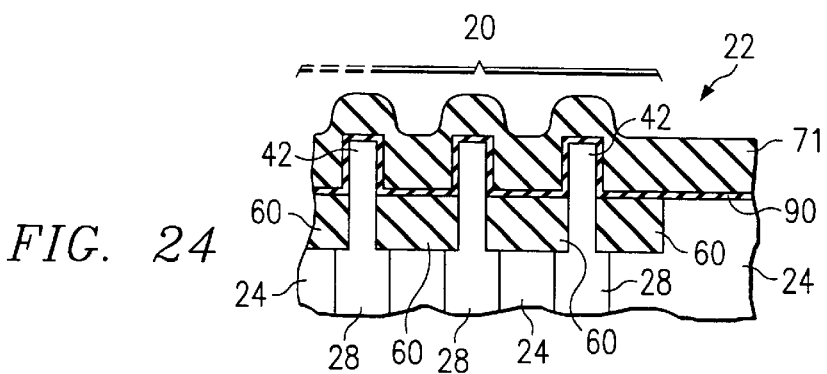
FIG. 24 is a cut-away cross-section view of the alignment mark region of FIG. 23 after applying a top oxide layer thereon.
Figure 25:
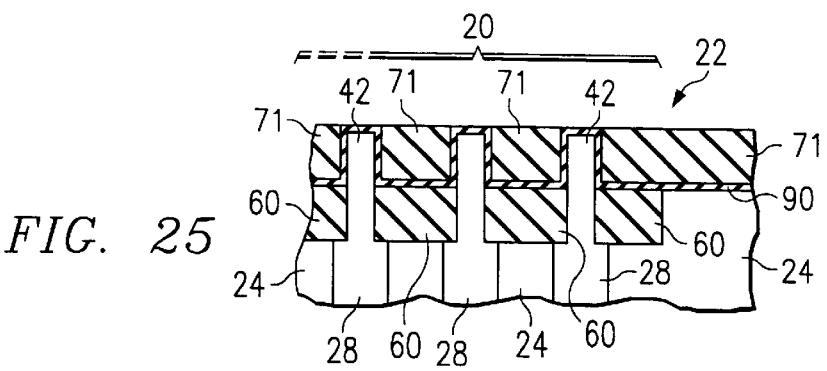
FIG. 25 is a cut-away cross-section view of the alignment mark region of FIG. 24 after planarizing the surface.
Figure 26:
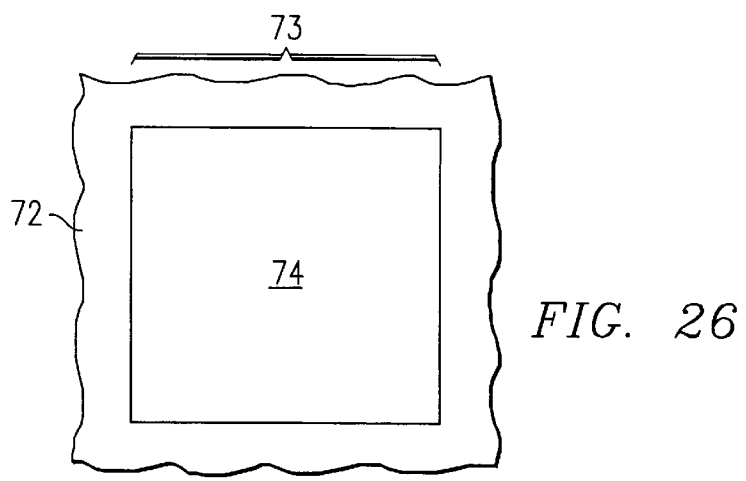
FIG. 26 is a plan view of an alignment mark area of an etch support mask.

Progressing from FIG. 13 to FIG. 23, an optional etch stop layer 90 is formed over the alignment mark region 20 while such layer is formed in the circuit region (not shown). The etch stop layer 90 may comprise nitride or oxide, for example, for shielding the polysilicon studs 42 during etching steps that are not selective to polysilicon. Next, as shown in FIG. 24, a top oxide layer 71 is formed over the alignment mark region 20 concurrently with the formation of this layer 71 in the circuit region (not shown). The top oxide layer 71 is then planarized to remove the excess of the oxide layer 72, as shown in FIG. 25, which may be done by a CMP process and/or any other planarizing method know to those of ordinary skill in the art.

Figure 27:
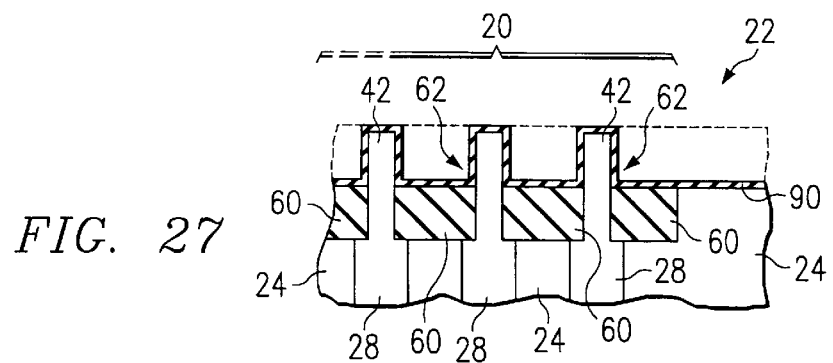
FIG. 27 is a cut-away cross-section view of the alignment mark region of FIG. 26 after removing the top oxide layer therefrom.

As noted above, the planarization process for the top oxide layer 71 yields an alignment mark structure 22 that is also planar, but the desired result is a step feature that can be seen when an opaque material layer covers the alignment structure 22. Thus, when the oxide layer 71 is etched for the circuit region, it should be exposed, etched, and removed in the alignment mark region 20. By having an opening 74 in the etch support mask 72 at the alignment region 73 corresponding to the alignment region 20 on the wafer (see mask 72 in FIG. 26), the top oxide layer 71 will be removed while processing the oxide layer 71 in the circuit region (not shown). FIG. 27 shows the alignment mark structure 22 after removing the top oxide layer 71 at the alignment region 20. Note in FIG. 27 that after the removal of the oxide layer 71 from the alignment mark region 20, the step features 62 of the alignment mark structure 22 is restored.

Figure 28A:
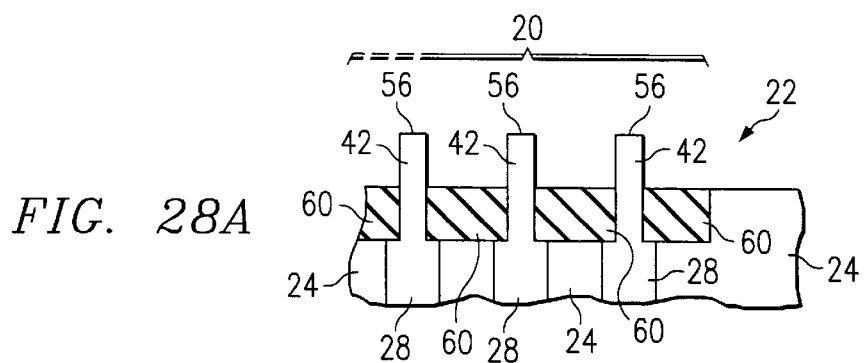
FIG. 28A is a cut-away cross-section view of the alignment mark region of FIG. 27 after removing the first etch stop layer therefrom.

As shown in FIG. 28A, next the etch stop layer 90, which is a nitride in this example, is stripped during a process for the circuit region (not shown). Next, a second etch stop layer 64 is formed over the alignment mark region 20. The etch stop layer 64 is an oxide layer in this example, and it is developed while developing a support gate oxide for a planar transistor device in the support area of the circuit region (not shown). However, the second etch stop layer 64 may not be needed in this example if the first etch stop layer 90 is not removed yet. As another alternative, if the first etch stop layer 90 is not used in this example, then the second etch stop layer 64 will be needed to protect the polysilicon studs 42 during subsequent etches.

Figure 30:
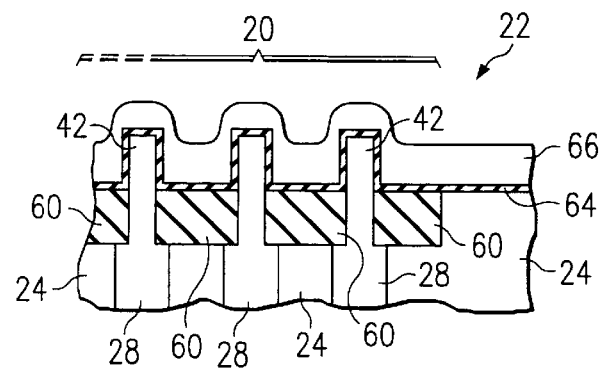
FIG. 30 is a cut-away cross-section view of the alignment mark region of FIG. 29 after applying a polysilicon layer thereon.
Figure 31:
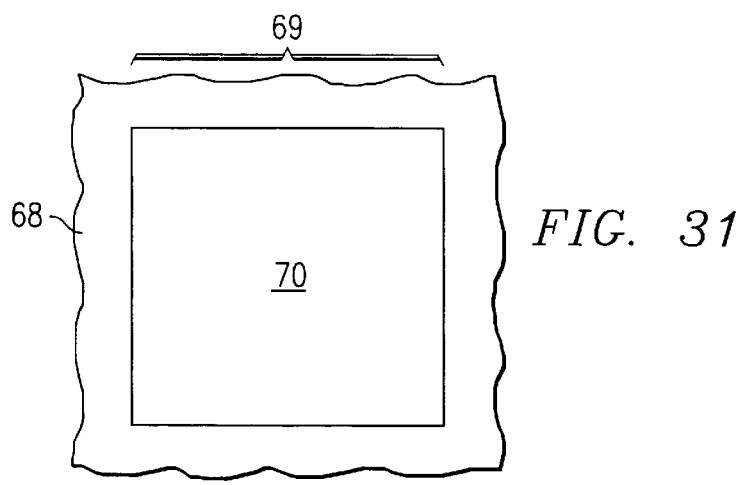
FIG. 31 is a plan view of an alignment mark area of an etch array mask.
Figure 32:
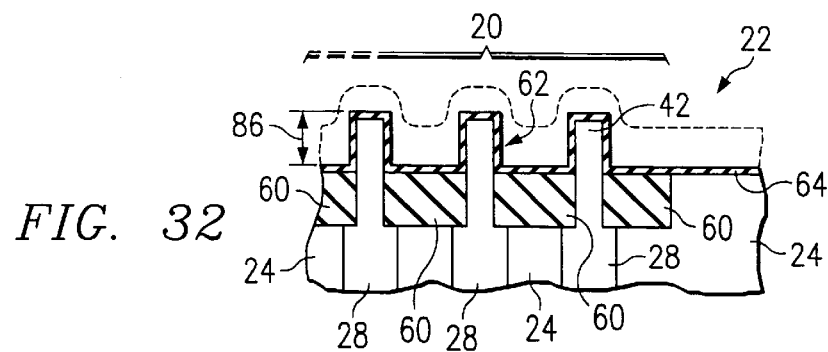
FIG. 32 is a cut-away cross-section view of the alignment mark region of FIG. 30 after removing the polysilicon layer therefrom.
Figure 33A:
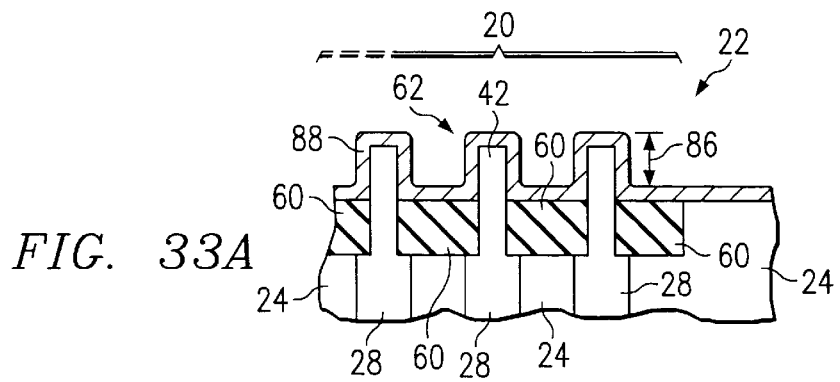
FIG. 33A is a cut-away cross-section view of the alignment mark region of FIG. 32 after removing the second etch stop layer therefrom and applying an opaque material layer thereon.
Figure 33B:
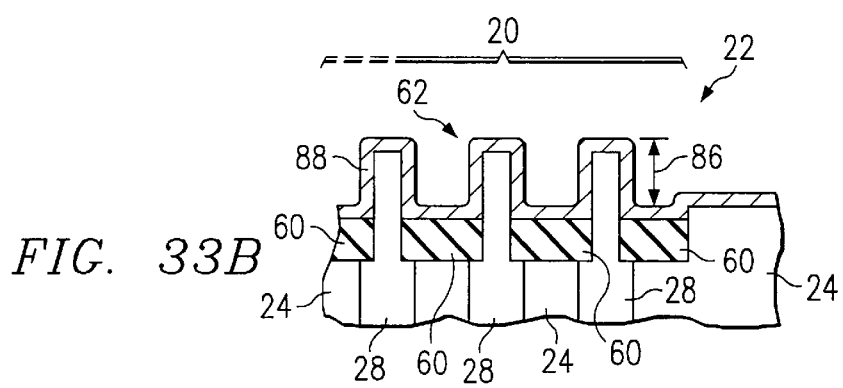
FIG. 33B is a cut-away cross-section view of the alignment mark region of FIG. 28B after applying a second etch stop layer thereon, applying a polysilicon layer thereon, removing the polysilicon layer therefrom, removing the second etch stop layer therefrom, and applying an opaque material layer thereon.

In FIG. 30, a polysilicon layer 66 has been formed over the alignment mark structure 22, concurrently with the formation of the polysilicon layer 66 in the circuit region for forming a planar transistor gate. While exposing, developing, and etching the circuit region using an etch array mask 68 (see FIG. 31), the polysilicon layer 66 in the alignment region 20 is removed, as shown in FIG. 32, because the etch array mask 68 is open at the alignment region 69 of the mask 68. Referring to FIG. 32, the alignment mark structure 22 is formed, which has step features 62 of a sufficient height 86 so that the alignment mark can be seen after an opaque layer 88 has been formed over the alignment structure 22, as shown in FIG. 33A. In FIG. 33A, the etch stop layer 64 has been removed, during a process concerning the circuit region, before the opaque material layer 88 was formed. Note that as desired, the step features 62 are still present in the alignment structure 22 after the opaque material layer 88 is formed (see FIG. 33A).

Figure 33C:
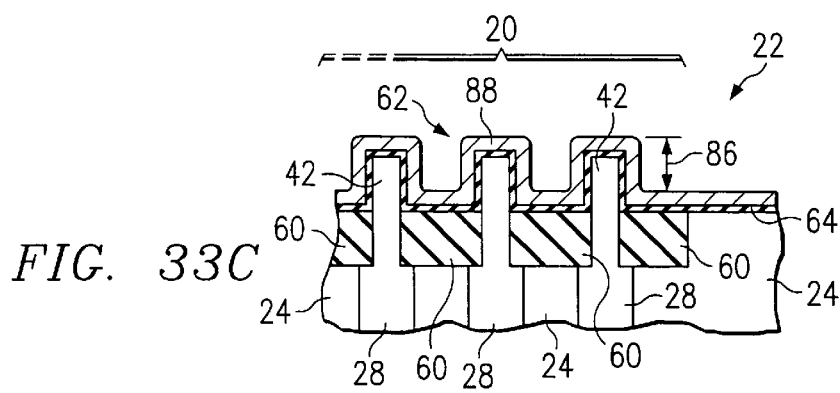
FIG. 33C is a cut-away cross-section view of the alignment mark region of FIG. 32 after applying an opaque material layer thereon, but without removing the second etch stop layer therefrom.

If there was not an opportunity to remove the etch stop layer 64 in FIG. 32 (i.e., during the processing of the circuit region) before the opaque material layer 88 was applied, as shown in FIG. 33C, the alignment mark structure 22 would still retain the step features 62. Thus, FIG. 33C illustrates a third embodiment where the etch stop layer 64 is not removed.

Figure 28B:
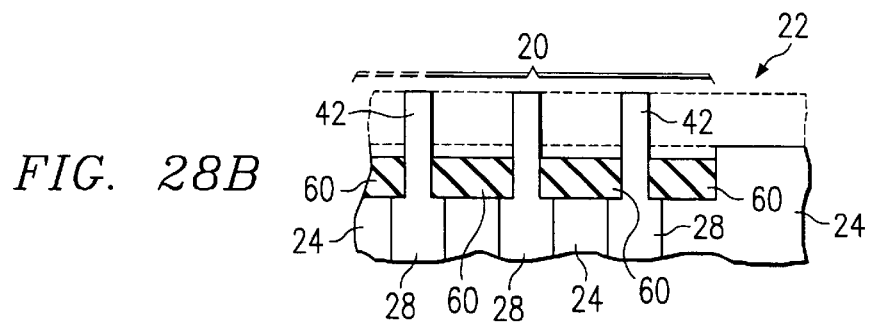
FIG. 28B is a cut-away cross-section view of the alignment mark region of FIG. 25 after removing the top oxide layer and part of the isolation trench oxide therefrom in the case when an etch stop layer is not applied in FIG. 23.
Figure 29:
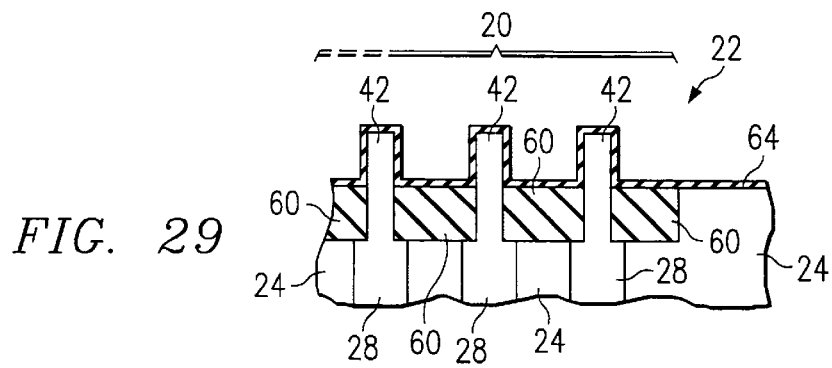
FIG. 29 is a cut-away cross-section view of the alignment mark region of FIG. 28A after applying a second etch stop layer thereon.

In a fourth embodiment of the present invention, the second embodiment may be varied in another way. The fourth embodiment has the same sequence of steps as the second embodiment, except that the first etch stop layer 90 is not applied at FIG. 23. Thus, when the top oxide layer 71 is applied (similar to FIG. 24), planarized by CMP (similar to FIG. 25), exposed by through the etch support mask 72 of FIG. 26, and etched away, part of the isolation trench oxide 60 at the alignment mark region 20 may also be etched away, as shown in FIG. 28B (assuming the etch is selective to polysilicon so that the studs 42 are not significantly eroded). The resulting alignment mark structure 22 of FIG. 28B may be more desirable because it has larger step features 62 with greater height 86 than that of FIG. 28A. This increased step height 86 is retained in the subsequent steps, which are the same as those described above for the second embodiment (FIGS. 29–32), as shown in FIG. 336 when the opaque material layer 88 is formed over the alignment mark structure 22.

Figure 34A:
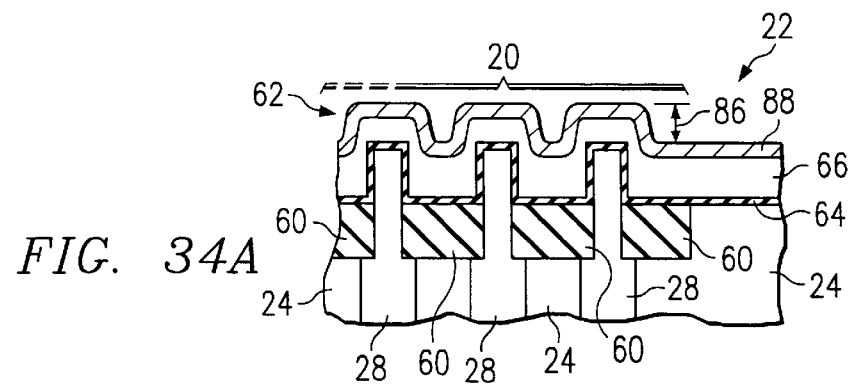
FIG. 34A is a cut-away cross-section view of the alignment mark region of FIG. 30 after applying an opaque material layer thereon, but without removing the polysilicon layer and the second etch stop layer therefrom.
Figure 34B:
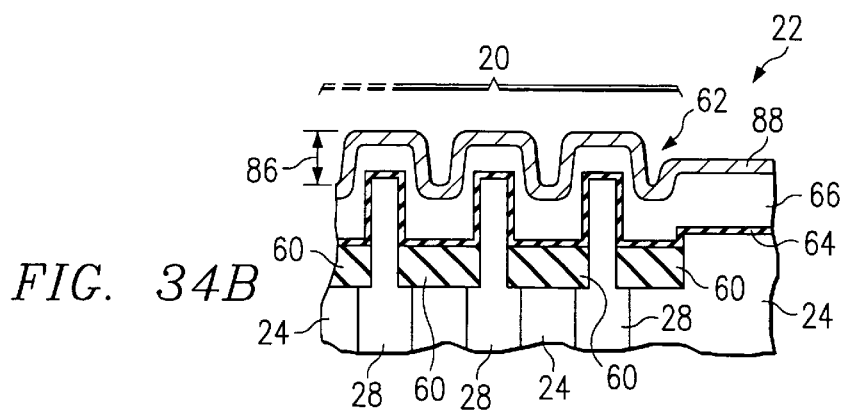
FIG. 34B is a cut-away cross-section view of the alignment mark region of FIG. 28B after applying a second etch stop layer thereon, applying a polysilicon layer thereon, and applying an opaque material layer thereon, but without removing the polysilicon layer and the second etch stop layer therefrom.

A fifth embodiment of the present invention is shown in FIGS. 1–13, 23–28A, 29–30, and 34A. The fifth embodiment has the same steps as the second embodiment up to FIG. 30. In the fifth embodiment, the etch support mask 72 is open (see FIG. 26), but the etch array mask 68 is either not used due to the processing steps involved in developing the circuit region, or the etch array mask is closed (i.e., no opening 70 in the mask 68, as in FIG. 31). Thus, the etch stop layer 64 and the support polysilicon layer 66 may not be removed. However, as shown in FIG. 34A, because the gate oxide layer 64 and the support polysilicon layer 66 are conformal, the step features of the alignment mark structure 22 are still present with a height 86 sufficient to allow the alignment mark structure 22 to be seen after the opaque material layer 88 is formed over the alignment mark region 20. The fifth embodiment may be altered to form a sixth embodiment of the present invention. The sixth embodiment has the same steps as the fifth embodiment, except that the first etch stop layer 90 is not applied or not retained (i.e., if applied and allowed to be etched or stripped before applying the top oxide layer 71) at FIG. 23. Thus, instead of FIGS. 28A and 34A, the sixth embodiment has FIG. 28B and results in FIG. 34B. Note in FIG. 34B that the step features 62 of the alignment mark structure 22 have a greater height 86, than those of the fifth embodiment in FIG. 34A.

Figure 35:
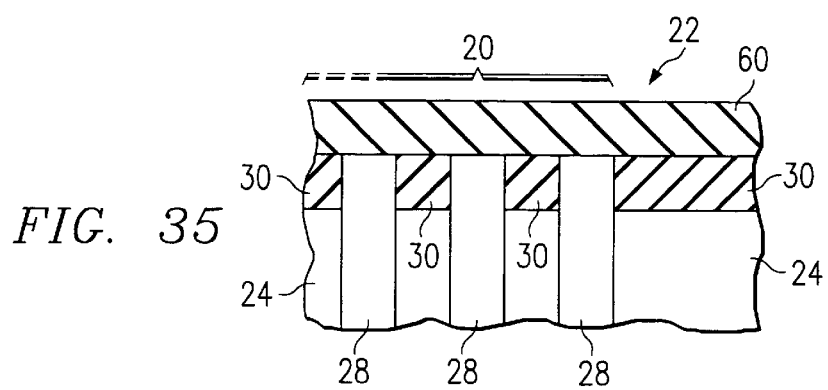
FIG. 35 is a cut-away cross-section view of the alignment mark region of FIG. 5 after applying a isolation trench oxide fill layer thereon.
Figure 36:
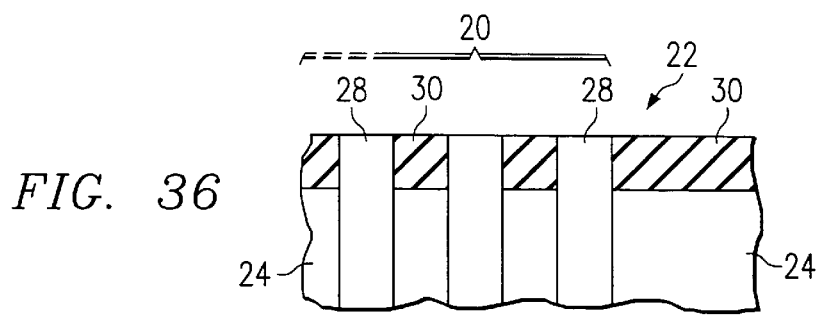
FIG. 36 is a cut-away cross-section view of the alignment mark region of FIG. 35 after planarizing the surface.
Figure 37:
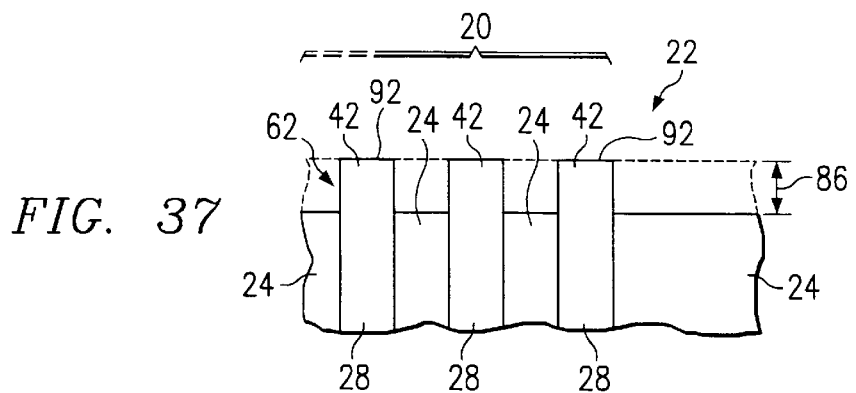
FIG. 37 is a cut-away cross-section view of the alignment mark region of FIG. 36 after stripping the pad nitride layer therefrom.

Although it will typically be desirable to use one of the first six embodiments of the present invention described above, which provide a gate conductor layer to active area alignment for example (discussed further below), the present invention may also be fabricated and configured to provide a gate conductor layer to deep trench alignment (also discussed further below). FIGS. 1–5 and 35–46 illustrate the steps used in forming a seventh embodiment of the present invention. FIGS. 1–5 have been discussed above herein. For the seventh embodiment, FIG. 35 continues from FIG. 5. As shown in FIG. 35, an isolation trench oxide layer 60 is formed over the wafer, while being formed for filling the isolation trenches in the circuit region (not shown). After CMP and deglaze processes, the isolation trench oxide layer 60 is removed from the alignment mark region 20, as shown in FIG. 36. Next, the pad nitride layer 30 is stripped, which reveals an upper portion of the polysilicon studs 42, as shown in FIG. 37. Thus, the polysilicon studs 42 extend above the substrate 24 to form step features 62 with a height 86 large enough to allow the alignment mark structure to be non-planar and to be seen after an opaque material layer 88 is formed thereon.

Figure 38:
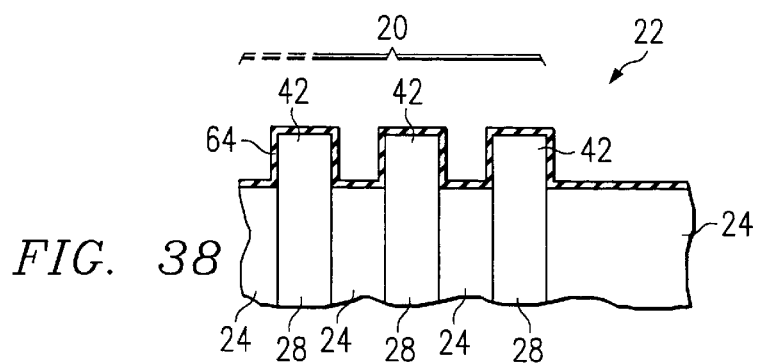
FIG. 38 is a cut-away cross-section view of the alignment mark region of FIG. 37 after applying an etch stop layer thereon.
Figure 39:
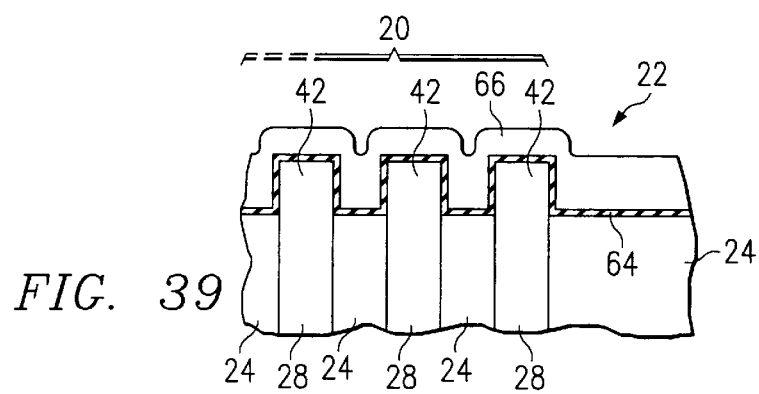
FIG. 39 is a cut-away cross-section view of the alignment mark region of FIG. 38 after applying a polysilicon layer thereon.
Figure 40:
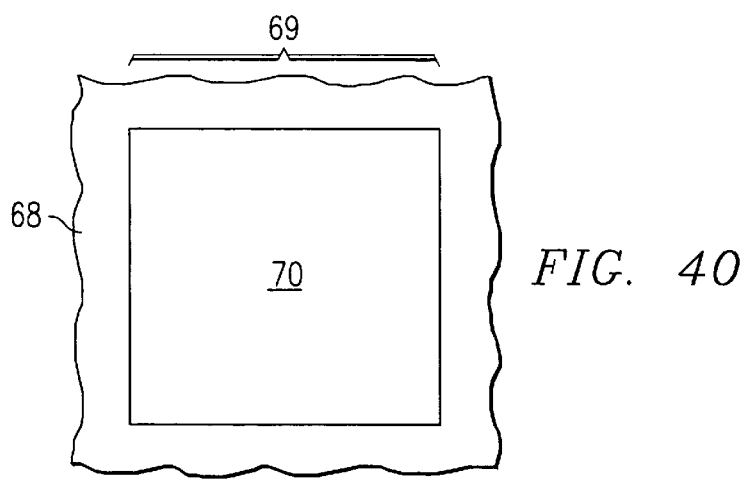
FIG. 40 is a plan view of an alignment mark area of an etch array mask.
Figure 41:
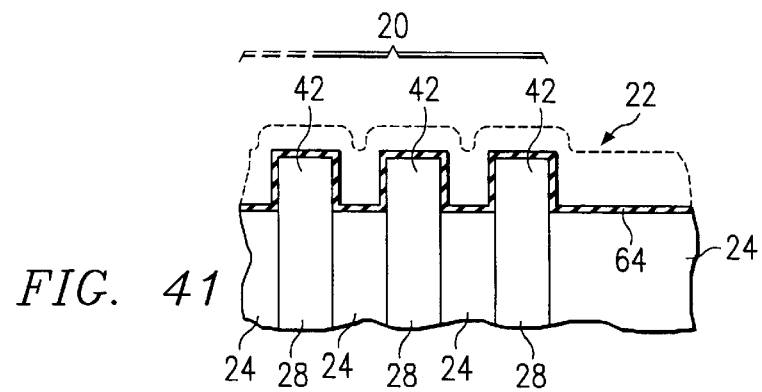
FIG. 41 is a cut-away cross-section view of the alignment mark region of FIG. 39 after removing the polysilicon layer therefrom.
Figure 42:
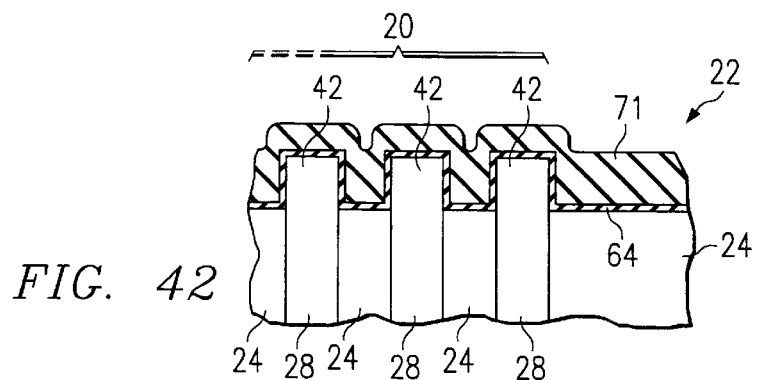
FIG. 42 is a cut-away cross-section view of the alignment mark region of FIG. 41 after applying a top oxide layer thereon.
Figure 43:
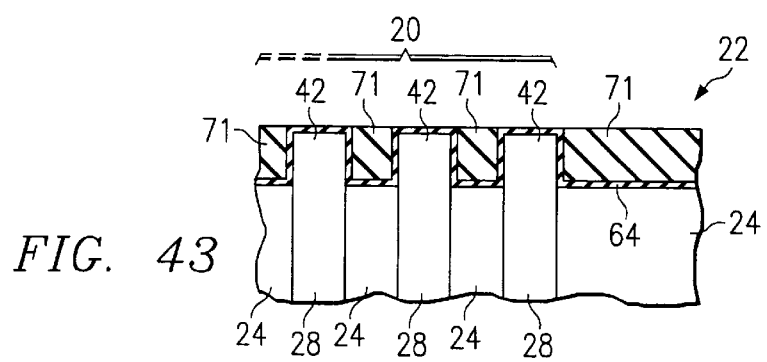
FIG. 43 is a cut-away cross-section view of the alignment mark region of FIG. 42 after planarizing the surface.
Figure 44:
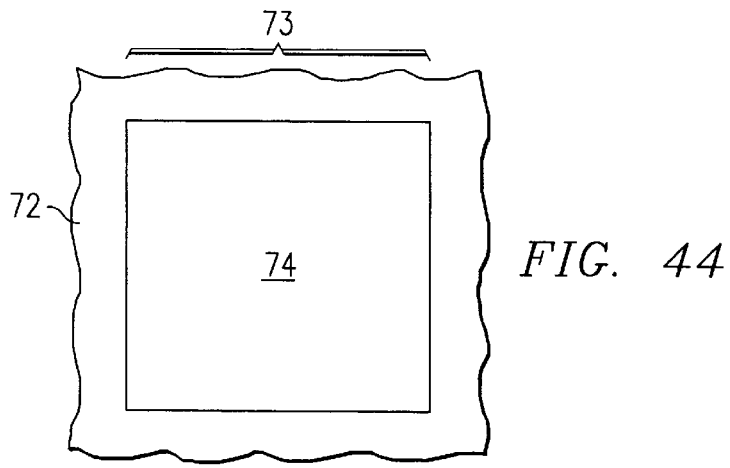
FIG. 44 is a plan view of an alignment mark area of an etch support mask.

In FIG. 38, an etch stop layer 64 is formed over the alignment mark region 20, which in this example is a support gate oxide layer being forming in the circuit region for the development of a planar transistor in the support area (not shown). In FIG. 39, a support polysilicon layer 66 is then formed over the etch stop layer 64, concurrently with the formation of the polysilicon layer 66 for the development of a planar transistor in the support area of the circuit region (not shown) for this example. While exposing, developing, and etching the circuit region using an etch array mask 68 (see FIG. 40), the polysilicon layer 66 in the alignment region 20 is removed, as shown in FIG. 41, because the etch array mask 68 has an opening 70 at the alignment mark area 69 of the mask 68. The etch stop layer 64 prevents the etching of the polysilicon layer 66 from etching away the upper portion of the polysilicon studs 42.

Figure 45:
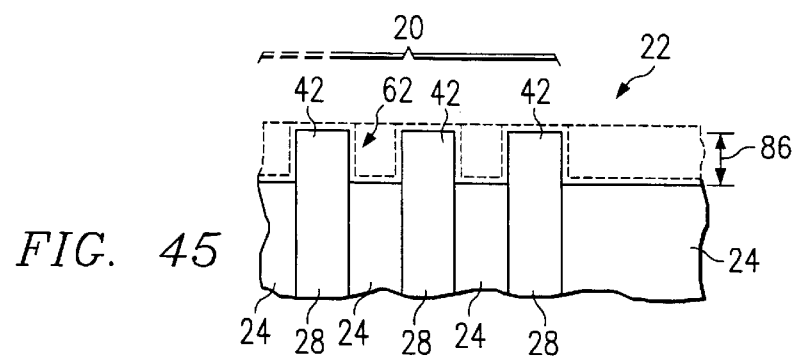
FIG. 45 is a cut-away cross-section view of the alignment mark region of FIG. 43 after removing the top oxide layer and the etch stop layer therefrom.
Figure 46:
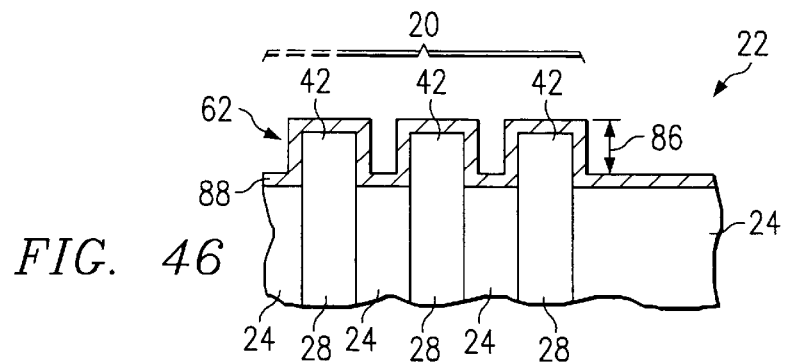
FIG. 46 is a cut-away cross-section view of the alignment mark region of FIG. 45 after applying an opaque material layer thereon.

After a top oxide layer 71 is applied over the wafer (see FIG. 42) and after the top oxide layer 71 is planarized by CMP (see FIG. 43), the top oxide layer 71 is removed from the alignment mark region 20. While exposing, developing, and etching the circuit region using an etch support mask 72 (see FIG. 44), the top oxide layer 71 and the etch stop layer 64 in the alignment region 20 are removed, as shown in FIG. 45, because the etch support mask 72 has an opening 74 at the alignment region 73 of the mask 72. Thus, as shown in FIG. 45, the alignment mark structure again has step features 62 as the studs 42 again are exposed and extend above the substrate 24. Therefore, when an opaque material layer 88 (e.g., a gate conductor layer comprising metal material) is formed over the alignment mark structure 22 as shown in FIG. 46, the step features 62 still have a sufficient height 86 so that the alignment mark structure can be seen and used for aligning one or more subsequent masks.

Figure 47:
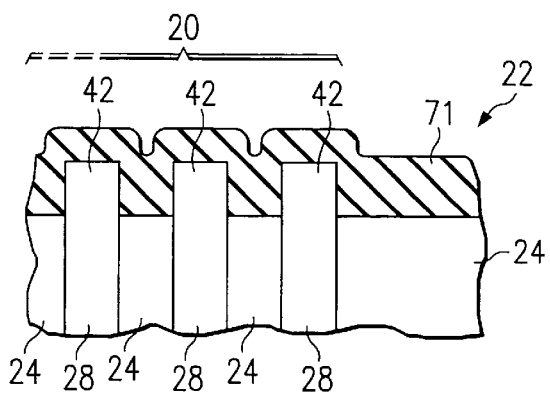
FIG. 47 is a cut-away cross-section view of the alignment mark region of FIG. 37 after applying a top oxide layer thereon.
Figure 48:
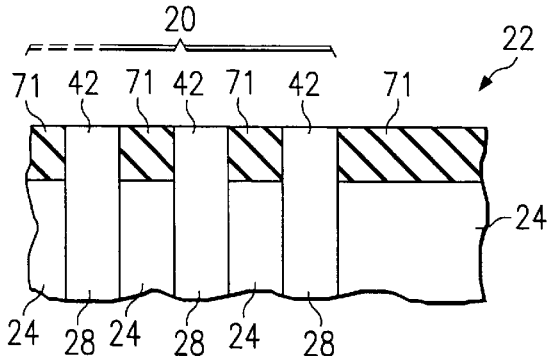
FIG. 48 is a cut-away cross-section view of the alignment mark region of FIG. 47 after planarizing the surface.
Figure 49:
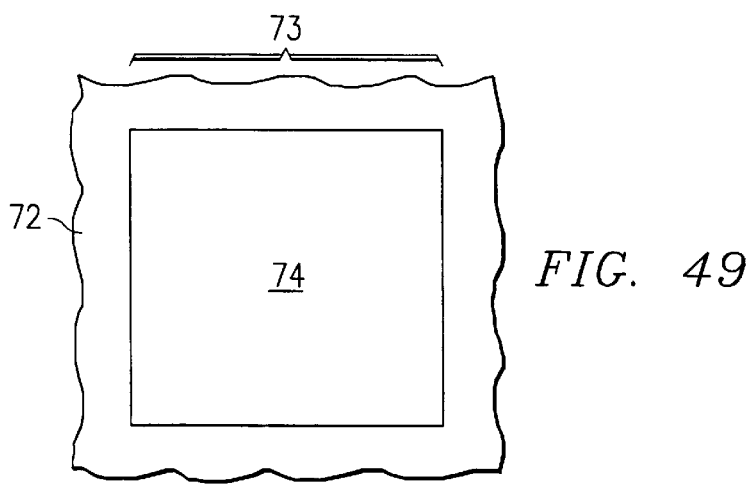
FIG. 49 is a plan view of an alignment mark area of an etch support mask.
Figure 50:
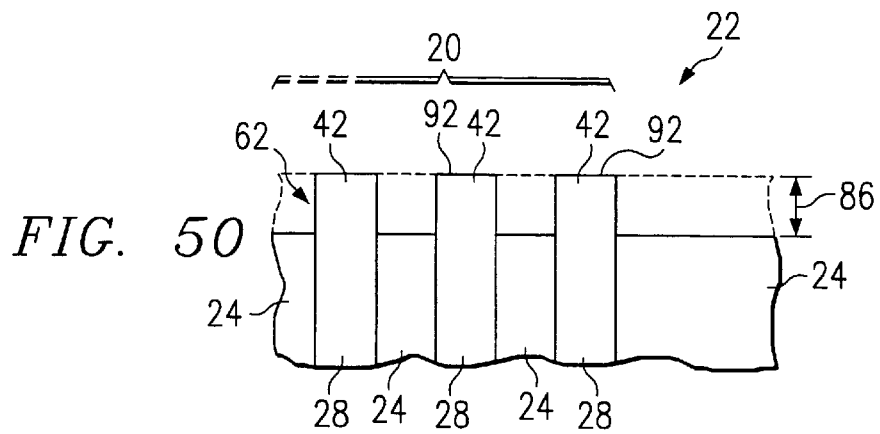
FIG. 50 is a cut-away cross-section view of the alignment mark region of FIG. 48 after removing the top oxide layer therefrom.
Figure 51:
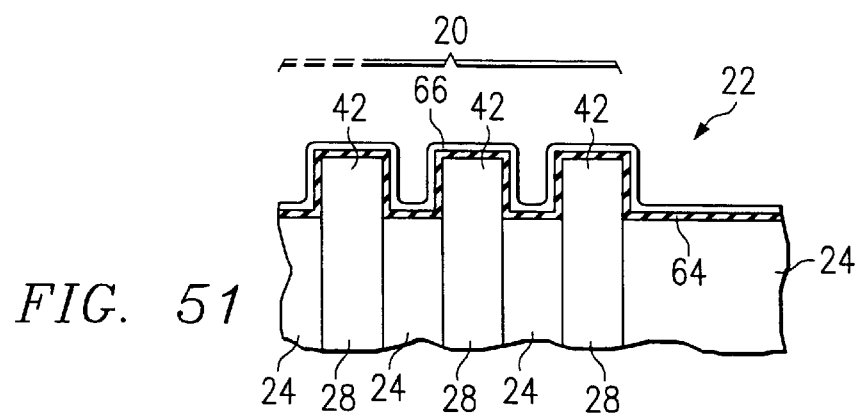
FIG. 51 is a cut-away cross-section view of the alignment mark region of FIG. 50 after applying an etch stop layer and a polysilicon layer thereon.
Figure 52:
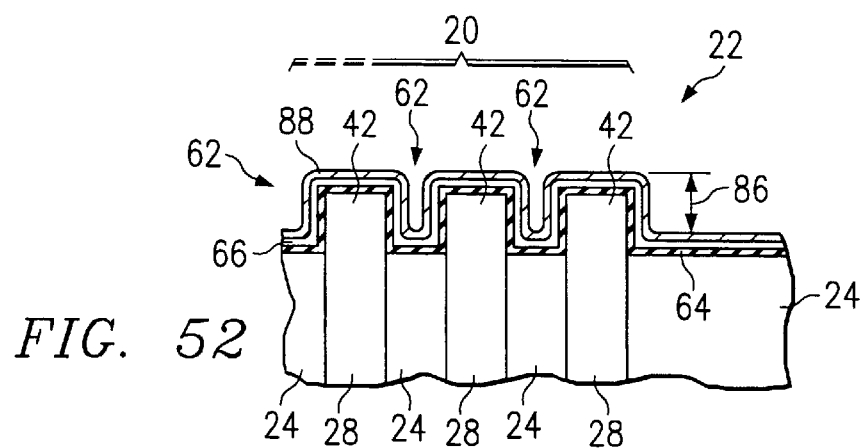
FIG. 52 is a cut-away cross-section view of the alignment mark region of FIG. 51 after applying an opaque material layer thereon.

In the seventh embodiment, the etch array mask 68 had an opening 70 at the alignment mark area 69 of the mask, which allowed the support polysilicon layer 66 to be removed. However, it may not be necessary to have the etch array mask 68 opened over the alignment mark region 20 for some cases. FIGS. 1–5, 35–37, and 47–52 illustrate the steps for an eighth embodiment of the present invention, wherein only the etch support mask 72 is opened over the alignment region 20. FIGS. 1–5 and 35–37 have been discussed already above. FIG. 47 continues from FIG. 37. In FIG. 47, the top oxide layer 71 is applied over the alignment mark region 20, concurrently with the formation of the top oxide layer 71 in the circuit region (not shown) for the development of the circuit region. Note that the order of the layers being applied in the eighth embodiment differs from that the seventh embodiment. Next, the top oxide layer 71 is subjected to CMP to planarize the surface, which makes the alignment mark structure 22 become planarized also, as shown in FIG. 48. While exposing, developing, and etching the circuit region using an etch support mask 72 (see FIG. 49), the top oxide layer 71 in the alignment region 20 is removed, as shown in FIG. 50, because the etch support mask 72 has an opening 74 at the alignment region 73 of the mask 72. Thus, as shown in FIG. 50, the alignment mark structure 22 again has step features 62 as the studs 42 again are exposed and extend above the substrate 24. Next as shown in FIG. 51, an etch stop layer 64 and a support polysilicon layer 66 are formed over the alignment mark region 20, concurrently with the formation of these layers in the circuit region (not shown). Because the etch stop layer 64 and the polysilicon layer 66 are conformal to the surface of the alignment mark structure 22 (see FIG. 51) and due to the shape and geometry of the alignment mark structure 22, the alignment mark structure 22 is still present and still non-planar, as shown in FIG. 51. Therefore, when an opaque material layer 88 (e.g., a gate conductor layer comprising metal material) is formed over the alignment mark structure 22 as shown in FIG. 52, the step features 62 still have a sufficient height 86 so that the alignment mark structure 22 can still be seen and used for aligning one or more subsequent masks.

Figure 53:
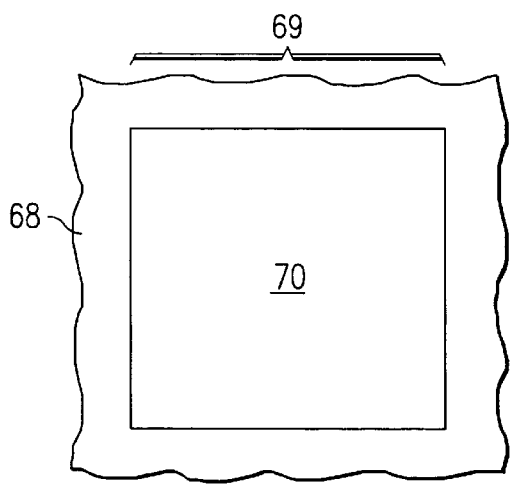
FIG. 53 is a plan view of an alignment mark area of an etch array mask.
Figure 54:
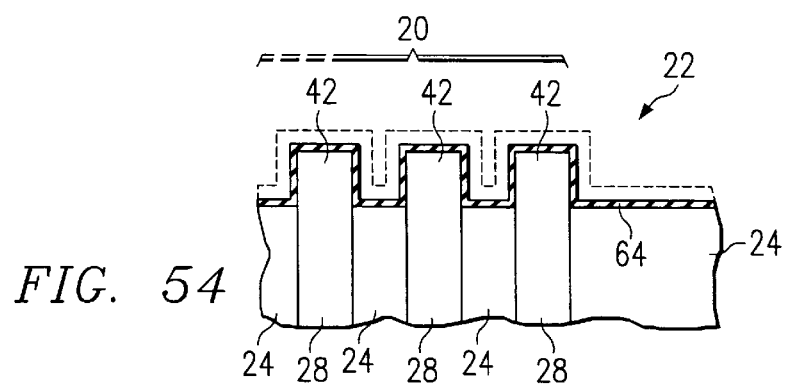
FIG. 54 is a cut-away cross-section view of the alignment mark region of FIG. 51 after removing the polysilicon layer therefrom.

In a ninth embodiment of the present invention, an etch array mask 68 is opened over the alignment mark region 20, but the order of the layers being formed is essentially the same as that of the eighth embodiment (as opposed to that of the seventh embodiment). Thus as compared to the seventh embodiment wherein the etch array mask 68 was used before the etch support mask 72, in the ninth embodiment, the etch support mask 72 is used before the etch array mask 68. FIGS. 1–5, 35–37, 47–51, and 53–55 illustrate the steps for the ninth embodiment. FIGS. 1–5, 35–37, and 47–51 have been discussed above. FIGS. 53 and 54 continue from FIG. 51. FIG. 54 shows the alignment mark structure 22 after the polysilicon layer 66 has been removed as a result of the etch array mask 68 having an opening 70 at the alignment mark area 69 of the mask 68. The etch stop layer 64 protects the studs 42 from being etched away. FIG. 55 shows the alignment mark structure 22 after an opaque material layer 88 is formed over the alignment mark structure 22. In alternative, the etch stop layer 64 may be removed before applying the opaque material layer 88.

An advantage of the present invention is that it allows the use of various mask permutations to create, with no additional processing steps, a planar configuration on the chip in the circuit region and step features with sufficient heights to provide alignment mark structures that can be seen after applying an opaque material layer.

An advantage of using the first six embodiments to develop the alignment mark structure 22 having the step features 62 is that the gate conductor mask is aligned with features of the active area (not shown) formed using the active area mask 46 rather being aligned to the deep trenches 26 formed by the deep trench mask 34, as in the last three embodiments described. In other words, because the top area 56 of the polysilicon studs 42 in the alignment mark region 20 are defined by the active area mask 46 (as shown in FIG. 8), the gate conductor mask (not shown) can be aligned to features defined by the active area mask 46, which is often preferable. If the top area 56 of the polysilicon studs 42 had not been reduced through the use of the active area mask 46 while forming the alignment mark isolation trenches 52, as shown in FIG. 37, the gate conductor mask can be aligned using the polysilicon studs 42 defined only by the deep trench mask 34 and referenced to features formed using the deep trench mask 34.

Comparing an example of alignment trees for these two scenarios will further clarify this advantage. First, if the top areas 56 of the polysilicon studs 42 in the alignment mark region 20 are not reduced and defined by the active area mask 46 and are thus defined by the deep trench mask 34 (as in FIG. 37), then the following alignment tree may exist: a bitline metal layer zero mask (M0) will be aligned to features defined by the active area mask (AA); the active area mark (AA) will be aligned to features defined by the deep trench mask (DT); the gate conductor mask (GC) will be aligned to features defined by the deep trench mask (DT); and a contact level (CS) will be aligned to features defined by the gate conductor mask (GC). In shorthand form, this first alignment tree may be expressed as:

M0 aligned to AA;
AA aligned to DT;
GC aligned to DT; and
CS aligned to GC.

For a second alignment tree resulting from the use of the present invention, if the top areas 56 of the polysilicon studs 42 in the alignment mark region 20 are reduced and defined by the active area mask 46, then the following alignment tree exists: a metal layer zero mask (M0) will be aligned to features defined by the active area mask (AA); the gate conductor mask (GC) will be aligned to features defined by the active area mask (AA); and a contact level (CS) will be aligned to the gate conductor mask (GC). Expressed in shorthand form, the second alignment tree is:

AA aligned to DT;
M0 aligned to AA,
GC aligned to AA; and
CS aligned to GC.

Hence, the alignment of M0 relative to CS is a fourth order alignment for the first alignment tree, and the alignment of M0 relative to CS is a third order alignment for the second alignment tree. Because use of a lower order alignment tree is preferable over a higher order alignment tree, use of the preferred method in accordance with the present invention provides an advantage of having a third order alignment tree for this case instead of a fourth order alignment tree. The order of an alignment tree, at least in part, determines how much space or real estate on the chip must be reserved to account for the margin of errors in alignments during production. It is always advantageous to have optimum alignment in an array, for example, because these are typically the smallest features, which thus need the highest level of repeatability.

Another advantage of the present invention is that the alignment mark structure 22 may be formed using standard processing steps without the need to add processing steps solely for the formation of an alignment mark structure. In the future, the alignment mark structures may have to be used in the circuit region, not only in the kerf. Thus, it may not be feasible or practical to have extra processing steps just for the formation of an alignment mark structure.

The nine embodiments described and illustrated herein are just some of the embodiments of the present invention. With the benefit of this disclosure and description, one skilled in the art will realize that there may be many other possible embodiments of the present invention. For example, an embodiment may vary from those described herein when the order of layers applied vary, the material types for the layers and etches vary, and/or the order of masks used vary to develop the circuit region.

It will be appreciated by those skilled in the art having the benefit of this disclosure that this invention provides method of forming an alignment mark structure using standard process steps for forming vertical gate transistors. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

The invention claimed is:

1. An alignment mark structure for aligning a mask with prior formed features of in a circuit region when an opaque material layer covers the alignment mark structure, comprising:

an alignment mark region stud extending from a deep trench filled with gate electrode material located in an alignment mark region, the deep trench being formed in a semiconductor substrate, wherein the alignment mark region stud is formed concurrently with a formation of a circuit region stud for a vertical gate transistor in a circuit region and without requiring additional processing steps solely for the formation of the alignment mark region stud, and wherein the alignment mark region stud has a top area defined by an active area mask;

an isolation trench formed adjacent to the deep trench filled with gate electrode material in the alignment mark region, the alignment mark region isolation trench being filled with insulating material, wherein the alignment mark region isolation trench filled with the insulating material is formed concurrently with a formation of an isolation wench filled with the insulating material that is located adjacent to the vertical gate transistor in the circuit region, and without requiring additional processing steps solely for the formation of the alignment mark region isolation trench filled with the insulating material; and a step feature formed between the top of the insulating material in the alignment mark region isolation trench and the top of the alignment mark region stud, wherein the height of the step feature is large enough that the step feature remains visible after the opaque material layer covers the alignment mark structure.

2. The alignment mark structure of claim 1, wherein the alignment mark region is located in a kerf region of a wafer.

3. The alignment mark structure of claim 1, wherein the alignment mark region is located in the circuit region.

4. The alignment mark structure of claim 1, wherein the opaque material layer comprises a gate conductor material.

5. The alignment mark structure of claim 1, wherein the top area of the alignment mark region stud is smaller than a cross-section area of the alignment mark region stud at a lower portion of the alignment mark stud, wherein the cross-section area at the lower portion is parallel with the top area.

6. The alignment mark structure of claim 1, wherein the top of the insulating material is located at a level below a top surface of the semiconductor substrate.

7. The alignment mark structure of claim 1, wherein the top of the insulating material is located at a same level as a top surface of the semiconductor substrate.

8. The alignment mark structure of claim 1, further comprising an etch stop layer formed over the alignment mark region stud and the insulating material.

9. The alignment mark structure of claim 8, further comprising a polysilicon layer formed on the etch stop layer.

10. The alignment mark structure of claim 1, further comprising a polysilicon layer formed over the alignment mark region stud and the insulating material.

11. The alignment mark structure of claim 1, wherein the deep trench of the alignment mark region stud is deeper than the isolation trench.

12. The alignment mark structure of claim 1, wherein the gate electrode material comprises polysilicon.

13. The alignment mark structure of claim 1, wherein the opaque material layer comprises a material selected from a group consisting of tungsten, tungsten nitride, tungsten silicide, polysilicon having a thickness greater than about 720 nm, copper, aluminum, metal, and combinations thereof.

14. The alignment mark structure of claim 1, wherein the insulating material is an oxide.

* * * * *

UNITED STATES PATENT AND TRADEMARK OFFICE
CERTIFICATE OF CORRECTION

PATENT NO. : 6,713,884 B2
DATED : March 30, 2004
INVENTOR(S) : Weis

It is certified that error appears in the above-identified patent and that said Letters Patent is hereby corrected as shown below:

Column 18,
Line 53, delete "wench" and insert -- trench --.

Signed and Sealed this

Twenty-second Day of June, 2004

JON W. DUDAS
*Acting Director of the United States Patent and Trademark Office*